US009552832B2

(12) United States Patent
Edelstein

(10) Patent No.: US 9,552,832 B2
(45) Date of Patent: Jan. 24, 2017

(54) READ-WRITE NON-ERASABLE MEMORY WITH LASER RECORDING AND METHOD OF RECORDING

(71) Applicant: U.S. Army Research Laboratory ATTN: RDRL-LOC-I, Adelphi, MD (US)

(72) Inventor: Alan S Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 14/972,018

(22) Filed: Dec. 16, 2015

(65) Prior Publication Data

US 2016/0104502 A1   Apr. 14, 2016

Related U.S. Application Data

(63) Continuation-in-part of application No. 14/469,995, filed on Aug. 27, 2014, now Pat. No. 9,245,617, which (Continued)

(51) Int. Cl.
*G11B 7/135*  (2012.01)
*G11B 5/02*   (2006.01)
(Continued)

(52) U.S. Cl.
CPC .................. *G11B 5/09* (2013.01); *G11B 5/012* (2013.01); *G11B 5/4866* (2013.01); *G11C 11/16* (2013.01);

(Continued)

(58) Field of Classification Search
CPC ............ G11B 5/314; G11B 2005/0021; G11B 11/10554; G11B 7/1374; G11B 2007/0006; G11B 7/1352; G11B 7/131; G11B 2005/0005; G11B 12/004; G11B 2013/008

(Continued)

(56) References Cited

U.S. PATENT DOCUMENTS 7,102,992 B1 *  9/2006  Dalziel ............... G11B 7/0935
                                                    369/112.24
7,394,730 B2 *  7/2008  Marinero ............... B82Y 10/00
                                                    369/13.14

(Continued)

OTHER PUBLICATIONS

IBM Scientists Achieve Storage Memory Breakthrough, Zurich, Switzerland—May 17, 2016: See—https://www-03.ibm.com/press/us/en/pressrelease/49746.wss.

*Primary Examiner* — Nabil Hindi
(74) *Attorney, Agent, or Firm* — Lawrence E. Anderson

(57) ABSTRACT

A nonvolatile memory comprising at least one ferromagnetic region having permeability which changes from a first state to a second state of lower permeability upon heating; at least one laser operatively associated with the at least one ferromagnetic region which selectively provides heat to the ferromagnetic region to change its p permeability; and a plurality of connectors operatively connected to the at least one laser and adapted to be connected to a current source that provides a current which causes the laser to change the at least one ferromagnetic region from a first state to a second state. Optionally, the memory is arranged as an array of memory cells. Optionally, each cell has a magnetic field sensor operatively associated therewith. Optionally, the non-volatile memory is radiation hard. Also, a method of recording data by heating at least one ferromagnetic region to change its permeability.

20 Claims, 38 Drawing Sheets

$H_{probe}$ Magnetic Field

Related U.S. Application Data is a continuation-in-part of application No. 14/109,398, filed on Dec. 17, 2013, now Pat. No. 8,824,200.

(60) Provisional application No. 62/092,994, filed on Dec. 17, 2014.

(51) Int. Cl.

| | |
|---|---|
| *G11B 5/09* | (2006.01) |
| *G11B 5/012* | (2006.01) |
| *G11B 5/48* | (2006.01) |
| *G11C 11/16* | (2006.01) |
| *G11C 13/00* | (2006.01) |
| *H01L 27/22* | (2006.01) |
| *G11C 13/04* | (2006.01) |
| *G11C 19/08* | (2006.01) |
| *G11B 5/00* | (2006.01) |

(52) U.S. Cl.
CPC .......... *G11C 11/161* (2013.01); *G11C 11/1675* (2013.01); *G11C 13/0004* (2013.01); *G11C 13/0061* (2013.01); *G11C 13/0069* (2013.01); *G11C 13/04* (2013.01); *G11C 19/0808* (2013.01); *H01L 27/222* (2013.01); *G11B 2005/0021* (2013.01); *G11C 2013/008* (2013.01); *G11C 2013/0078* (2013.01); *G11C 2013/0092* (2013.01)

(58) Field of Classification Search
USPC ..... 369/112.23, 112.14, 44.23, 44.14, 13.01, 369/13.33, 13.13, 120; 360/59, 133
See application file for complete search history.

(56) References Cited

U.S. PATENT DOCUMENTS 7,729,231 B2 * 6/2010 Gaudin ................. B82Y 10/00
369/283
8,374,060 B2 * 2/2013 Shimazawa ............ G11B 5/314
369/13.01

* cited by examiner

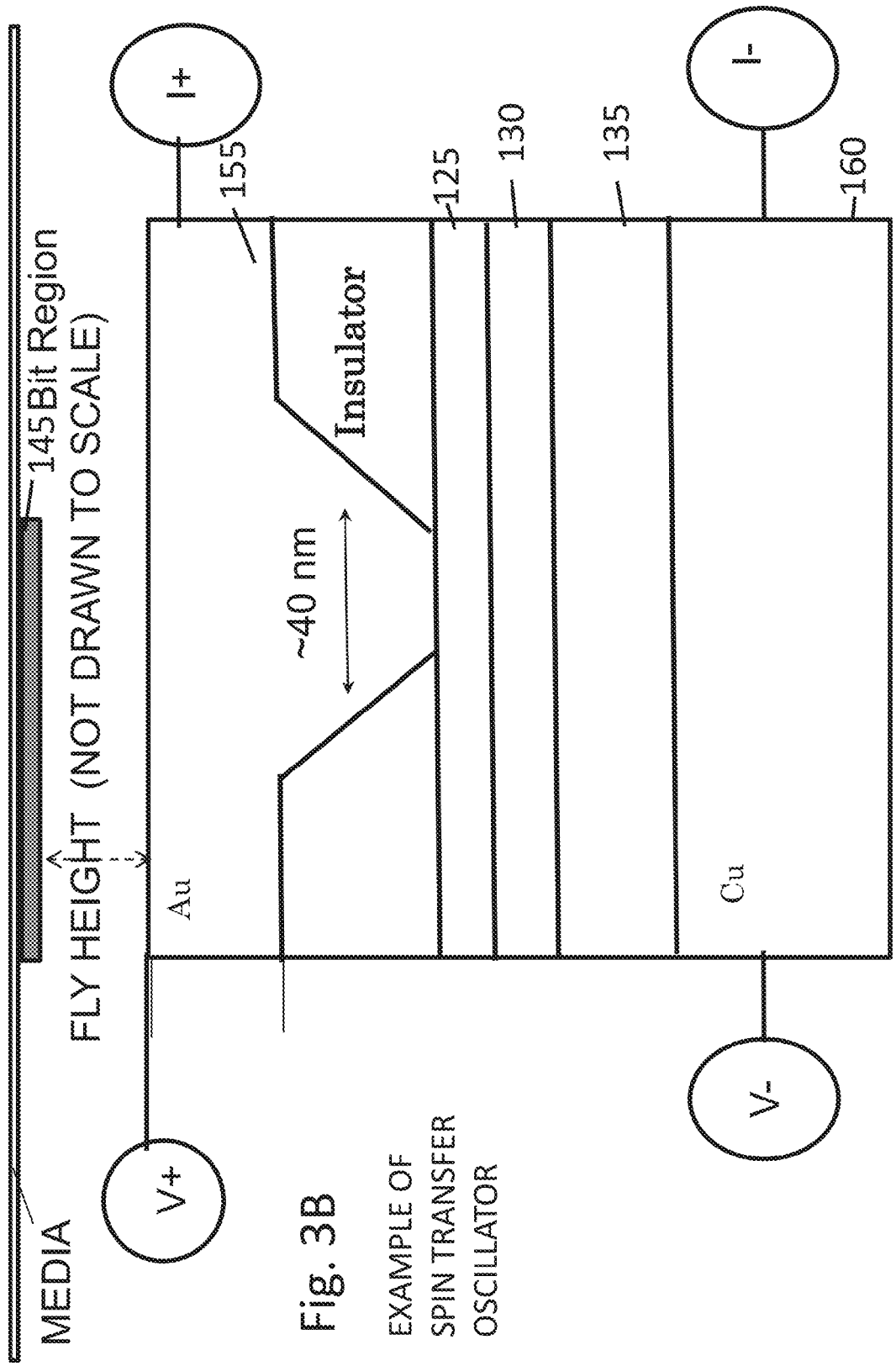

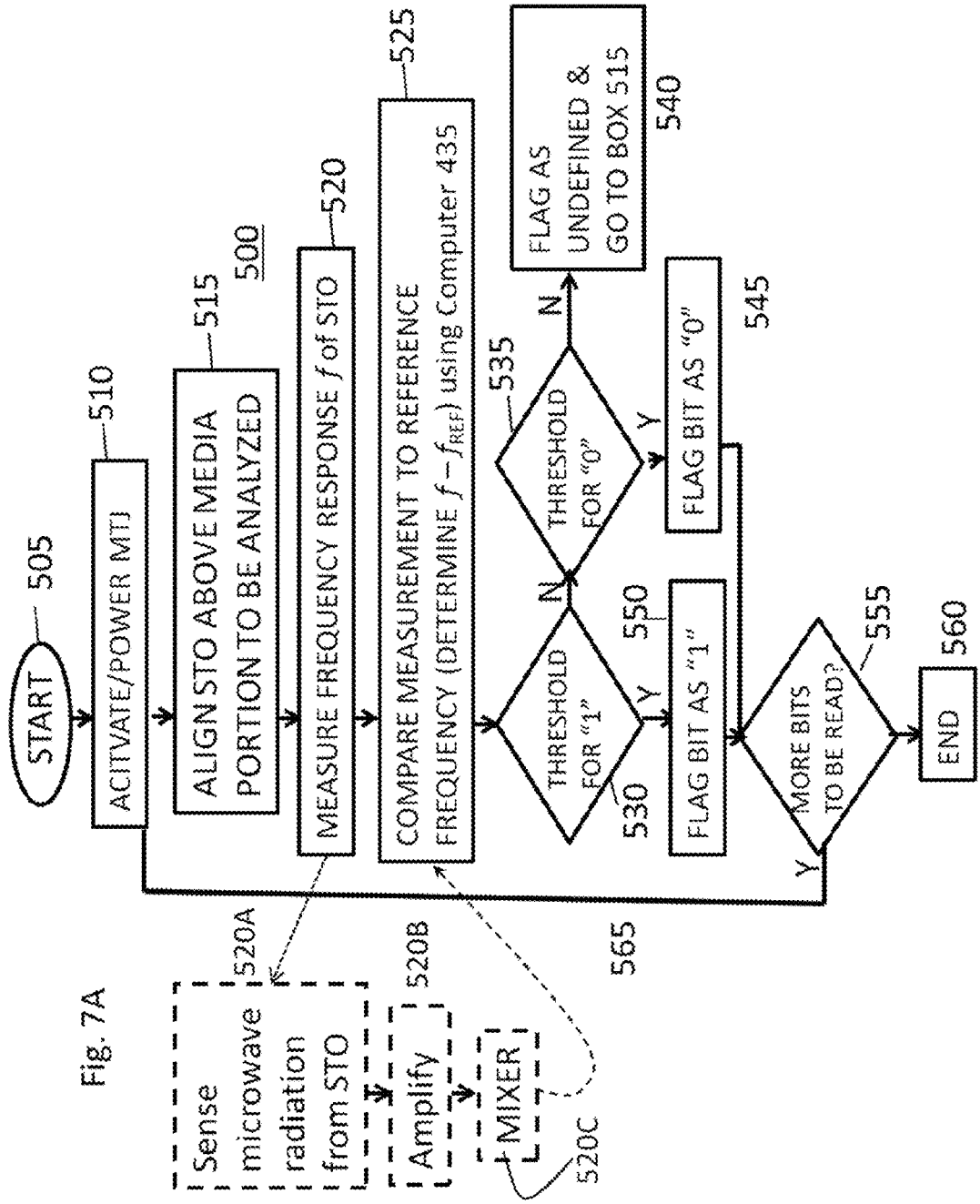

GRID OR ARRAY OF CANTILEVER HEATING ELEMENTS

IBM ™ PART

METGLAS

Side view

Parallel Writing with Heated Cantilever Array For Marking Metglas

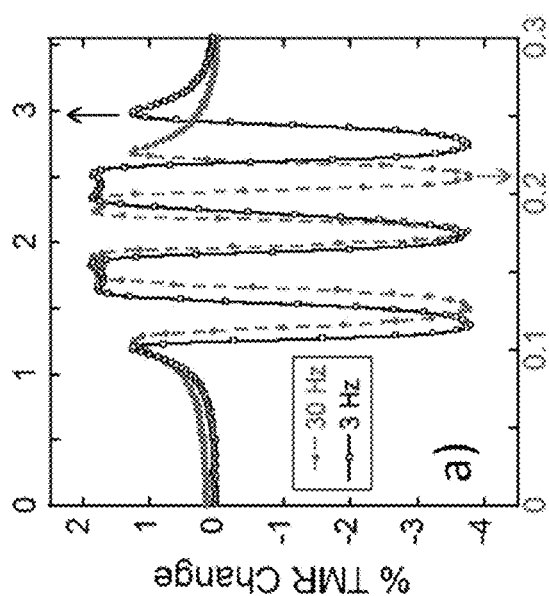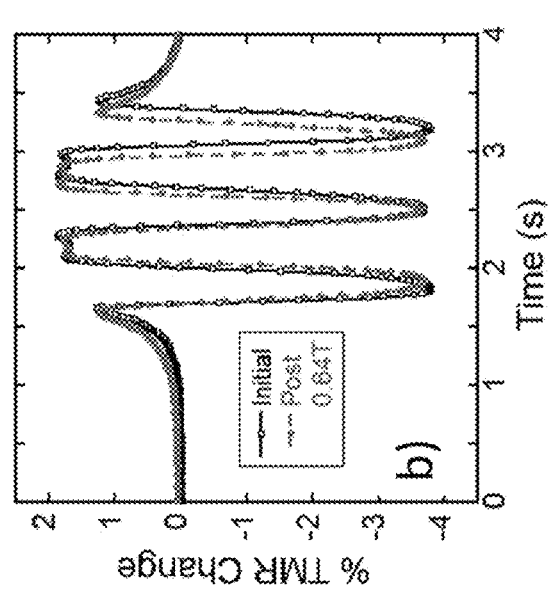
FIG. 14A
FIG. 14B

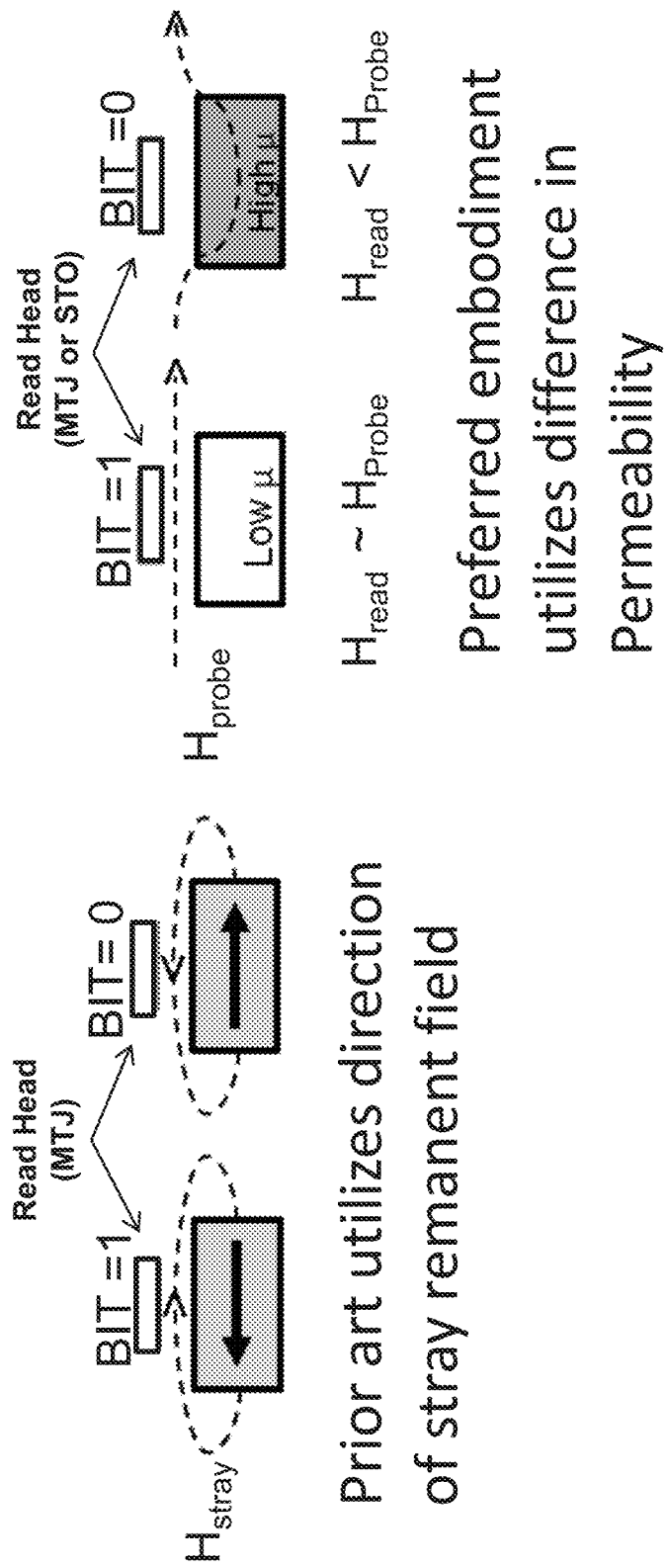

FIG. 21  Illustration showing areas of different magnetic permeability

Fig. 29 - Reading High Permeability Bit Using Spin Torque Oscillators (STO)

Radiates at Larmor precession frequency $$\frac{d\vec{M}}{dt} = \gamma\mu_0 \vec{M} \times \vec{H}_{eff}$$

Fig. 31 Alternative Approaches for Writing Submicron Features

READ-WRITE NON-ERASABLE MEMORY WITH LASER RECORDING AND METHOD OF RECORDING

CROSS REFERENCE TO RELATED APPLICATIONS

This application claims priority to U.S. Provisional Application No. 62/092,994, filed Dec. 17, 2014, entitled Read-write Non-erasable Memory with Heat Assisted Magnetic Recording Head, by Dr. Alan S. Edelstein, herein incorporated by reference in its entirety. This application is a continuation-in-part application of and claims priority to U.S. patent application Ser. No. 14/469,995 (US Pub. Appl. No. 20150170739) filed Aug. 27, 2014, by Dr. Alan S. Edelstein, which is a continuation-in-part application of and claims priority to U.S. patent application Ser. No. 14/109,398, now U.S. Pat. No. 8,824,200, entitled "Nonvolative Memory Cells Programmable by Phase Change," by Dr. Alan S. Edelstein, filed Dec. 17, 2013, all of which are herein incorporated by reference in their entirety.

STATEMENT OF GOVERNMENT INTEREST

The embodiments herein may be manufactured, used, and/or licensed by or for the United States Government without the payment of royalties thereon.

BACKGROUND OF THE INVENTION

The present invention is directed systems, apparatus and methods for the storage of information.

Magnetic storage has a limited storage lifetime, bit density, and volatility. The magnetic medium used in traditional disk storage degrades within a decade. The information is stored in small magnetic bit regions through magnetizing each region in a particular direction. Over time, the magnetization of the bit regions is corrupted by external electromagnetic forces or through exposure to the Earth's magnetic field or by thermal upsets. Thermal upsets are statistical processes that occur when the magnetization of a bit is thermally activated to overcome the anisotropy barrier. Magnetic tape is used extensively for archiving, but the tape deteriorates over time. With magnetic tape, there is an additional cost associated with controlling the temperature and humidity in order to slow down the deterioration of the tape. Another disadvantage of magnetic tape is that the access time for getting information from a particular part of the tape is long.

As electronic recording evolves and more information is digitized, there exists not just a critical necessity for storage volume but also increased storage permanency. A need exists for high density, stable, non-volatile memory with a longer storage life and less potential to be corrupted by external influences.

FIG. 1 is a schematic diagram of a prior art reader and writer. Information may be erased by exposure to a magnetic field or radiation. Information density/lifetime is limited by the superparmagnetic limit. Storing information for seven years requires $K_u V/k_B T > 50$ where $K_u$=crystalline anisotropy per unit volume, V=bit volume, $k_B$=Boltzman constant, and T=absolute temperature. Notably, there is a trade-off between high density and retention time.

SUMMARY OF THE INVENTION

The present invention is directed to, inter alia, storage of information using regions with different permeability and the use of laser heating in conjunction with recording to thermally change the permeability of, for example, Metglas or multilayers of copper and permalloy. In the latter case, it does this by having the copper diffuse into the permalloy and destroying the magnetism of the nickel.

The present invention utilizes the laser-heating device for heat-assisted magnetic recording to heat the substrate to change the magnetic permeability of the bit regions.

The present invention is also directed to a method of reading information from a magnetic medium based upon the magnetic permeability of the bit regions, some having low permeability and some having high permeability. The laser heating device(s) associated with heat-assisted magnetic recording operates to heat the substrate to change the magnetic permeability of the bit regions.

A preferred embodiment memory system comprises:
a substrate;
magnetic material operatively associated with the substrate, the magnetic material having at least one ferromagnetic region configured to store data having a first state of high permeability and a second state of low permeability; the at least one ferromagnetic region in the first state configured to be modifiable to a state of low permeability upon heating to permit modification of the bits of data;
at least one laser operatively associated with the at least ferromagnetic region which selectively provides heat to the at least one ferromagnetic region to change its permeability; and
a plurality of connectors operatively connected to the laser and adapted to be connected to a current source that provides a current which causes the laser to emit energy to change the permeability of the at least one ferromagnetic region.

BRIEF DESCRIPTION OF THE DRAWINGS

The embodiments herein will be better understood from the following detailed description with reference to the drawings, in which:

FIG. 3B is a schematic illustration of another exemplary preferred embodiment of the present invention using a spin torque oscillator a spectrum analyzer to read magnetic media.

FIG. 7A depicts an exemplary flow diagram to determine bit values of the read media using a STO.

FIG. 14A illustrates graphically the percentage change in tunneling magnetoresistance (TMR) resulting from sweeping 50 micron wide lines of permalloy, with 50 micron separation between the lines, at a fly height d of 10 microns, a probe field of 32 Oe, and at either a 3 or 30 Hz reading rate. Ten percent of data points are included in the figures and the sweeps are slightly offset on the time axis for clarity.

FIG. 14B illustrates graphically the percentage change in tunneling magnetoresistance (TMR) resulting from sweeping the reader under the 50 micron wide lines of permalloy, with 50 micron separation between the lines, at a fly height d of 10 microns, a probe field of 32 Oe, and at 3 Hz before and after a 60 second exposure to a 6400 Oe field. Ten percent of data points are included in the figures and the sweeps are slightly offset on the time axis for clarity.

FIG. 15 is a schematic comparison of current reading technology to that of a preferred embodiment of the present invention (shown to the right) which is based upon difference in permeability.

FIG. 36B differs from FIG. 36A in that electrodes or contacts 23 are used to connect externally mounted electrical switches 21 and switches 15 to the disc. Electrical switches 15, 21 determine which AND gate 8 is actuated and hence which bit gets a current pulse.

DETAILED DESCRIPTION OF PREFERRED EMBODIMENTS

Figure 1:
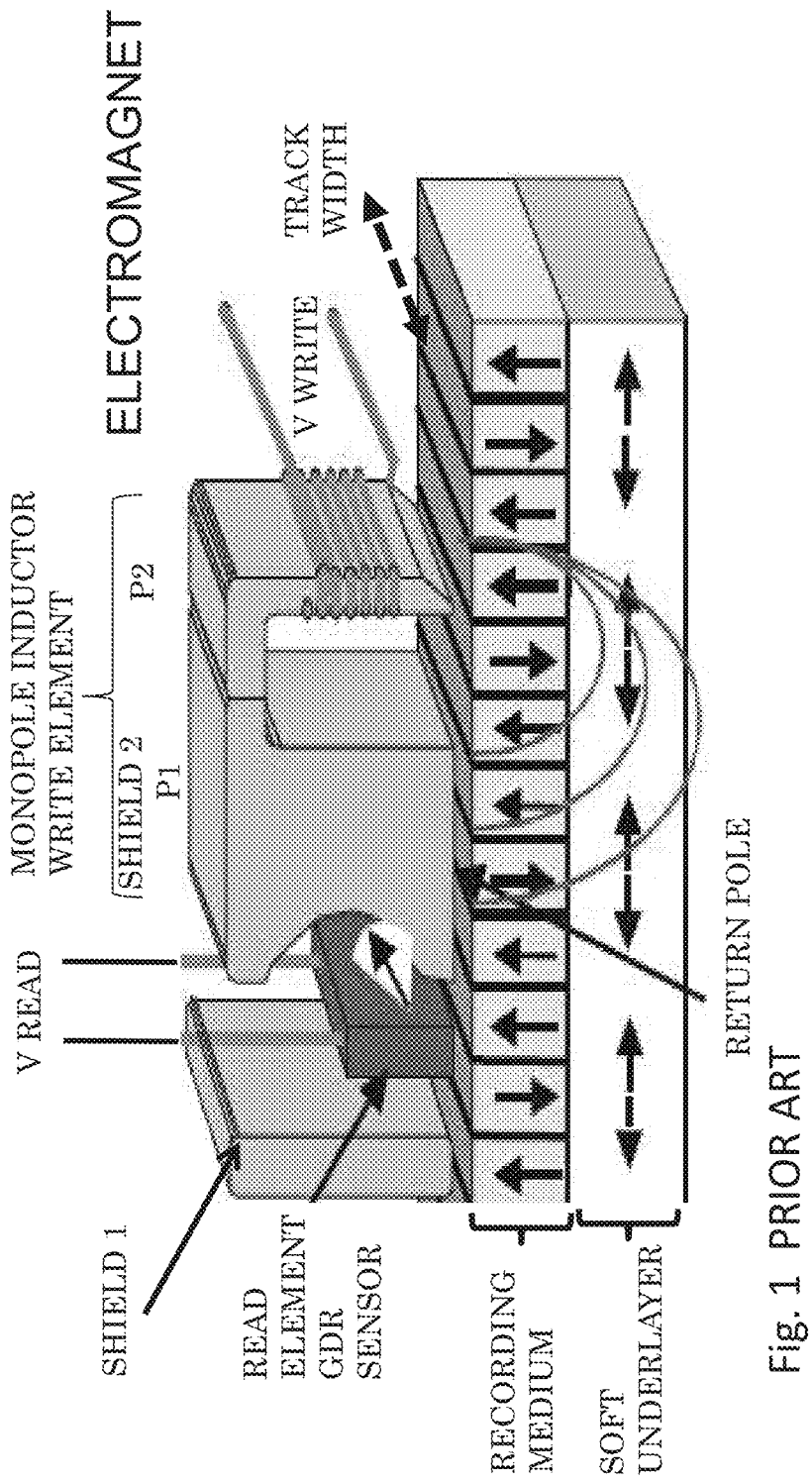
FIG. 1 is a schematic illustration of a prior art magnetic reader and writer set up.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skilled in the art to practice the embodiments of the invention. Accordingly, the examples should not be construed as limiting the scope of the embodiments of the invention.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second photons in a photon pair, these terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that are farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Figure 2:
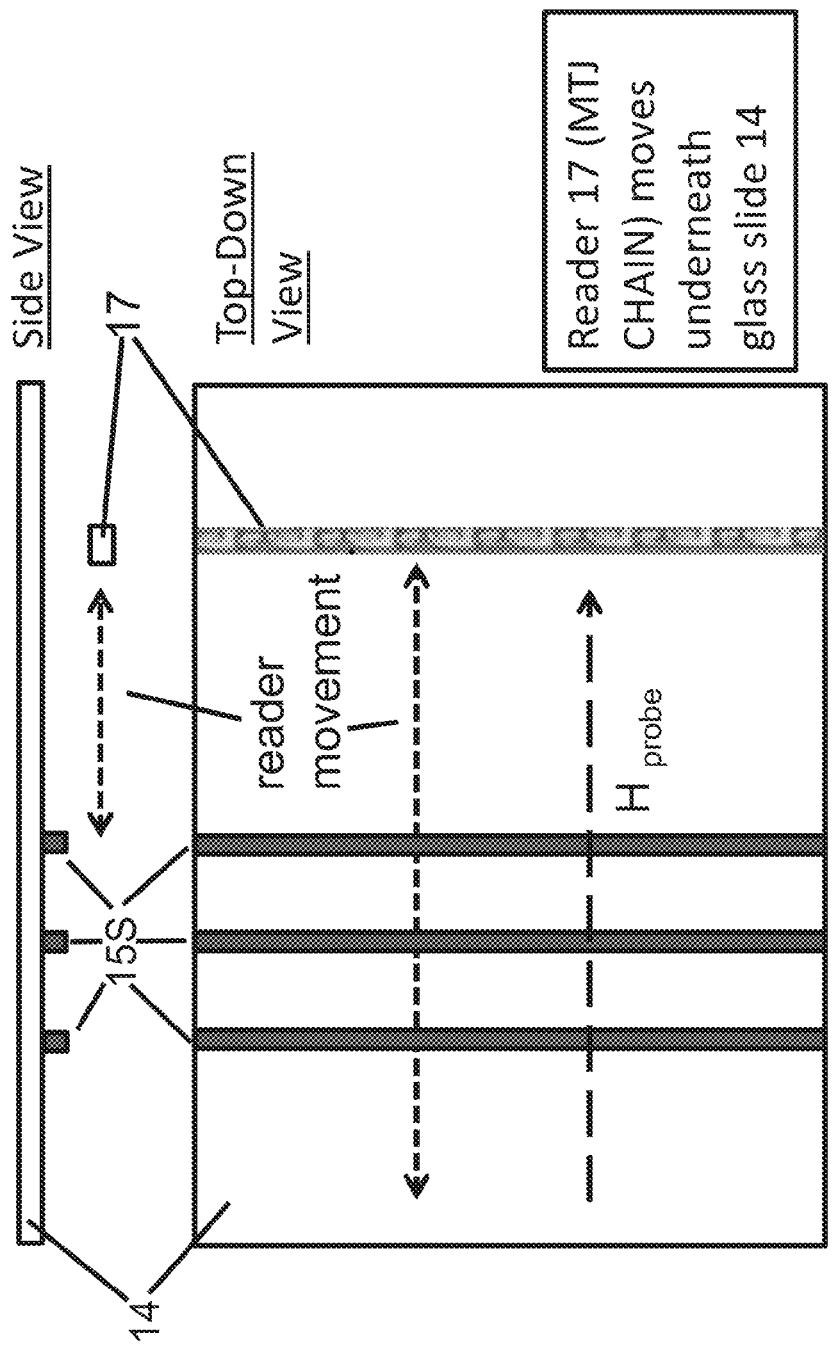
FIG. 2 is a schematic illustration of the view through microscope at 500× magnification of permalloy stripes 15S and magnetic tunnel junction (MTJ) reader chain 17.

A preferred methodology for reading media in a non-erasable (or nonvolatile) memory technology is based on bits of high and low magnetic permeability. Since permeability is an intrinsic property, this technology can potentially encode information at higher densities and with longer retention times than present magnetic storage based on spin domains. To illustrate the preferred embodiment technique, 10 micron wide magnetic tunnel junctions (MTJs) are used to read approximate 10 micron wide lines, with approximate 50 micron separation, of a soft magnetic material, permalloy, deposited on low permeability glass, as depicted in FIG. 2. The dimensions may be modified without departing from the scope of the present invention. A magnetic probe field is unaffected by the glass but is shunted away from the MTJs by the higher permeability permalloy lines. The difference in field sensed by the MTJs has a signal-to-noise ratio of 45 dB that persists and is not altered after the lines are exposed to fields of 6400 Oe. Reading information density with higher density can be accomplished by decreasing the size of the magnetic tunnel junctions and the separation between the bits and the MTJ.

Current magnetic memory technology that manipulates an extrinsic property of magnetic media, e.g., the direction of magnetization (as shown in FIG. 15), to encode information has two major disadvantages for data storage. First, since the information is written by applying a magnetic field to switch the spin direction, the information can also be erased by exposure to an inadvertent magnetic field. Secondly, the density and lifetime of the bits are restricted by the need to preserve thermal stability of the magnetic domains. Thermal stability of the domains is constrained by the super paramagnetic limit, as described in greater detail in Y. Zhimin, et al., in Magnetic Recording Conference, 2009. APMRC '09. Asia-Pacific. 2009 and R. F. L. Evans, Applied Physics Letters, 2012. 100(10): p. 102402-3. For example, to reliably store information at room temperature for 7 years, domain sizes above 5-50 nm are required to satisfy the Néel-Arrhenius relation $K_uV/k_BT>50$, where Via the volume of the bit, $K_u$ is the crystalline anisotropy, $k_B$ is the Boltzmann constant, and T is the absolute temperature. Alternative methods of information storage do not presently possess the density of magnetic memory and generally do not retain information indefinitely. Thus, each year billions of dollars worldwide must be spent duplicating huge amounts of data to prevent corruption by deteriorating of magnetic tapes, thermal upsets or accidental exposure to magnetic fields. To improve the ability to store information, a preferred embodiment technology stores information by using an intrinsic property of soft ferromagnetic materials, the magnetic permeability. The presence of high (low) permeability material modifies (does not affect) an external "probe" magnetic field. Any magnetic field modification is detected by a reader in close proximity to the media, which consists of regions of different permeability, as described in greater detail in U.S. Published Application No. 2008/0102320, by A. S. Edelstein and G. A. Fischer, entitled "Non-Erasable Magnetic Identification Media," hereby incorporated by reference. The media is non-erasable, as the magnetization of a soft ferromagnet returns to its original demagnetized state when the probe magnetic field is removed. Since the magnetic permeability is an intrinsic property dependent on the atomic arrangement of the media, it is insensitive to external influences (e.g., electromagnetic radiation and temperature) and should maintain an indefinitely long retention time under typical environmental conditions. Furthermore, there is no theoretical limit on the density that is equivalent to the restriction of the super paramagnetic limit. The limitation, instead, is the practical requirement of finding an economical method for reading and writing the information.

Figure 16:
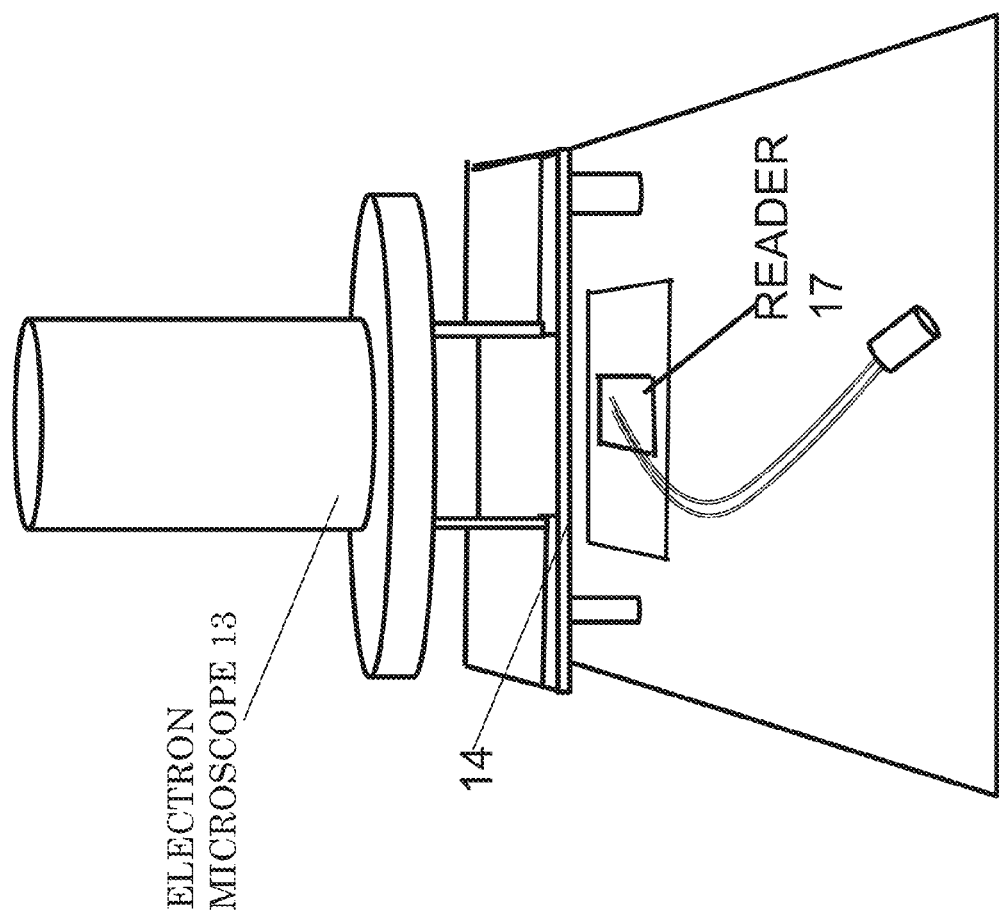
FIG. 16 is a schematic illustration depicting an electron microscope 13 having a glass 14 upon which permalloy is deposited and read by reader 17 as described above.

FIG. 2 comprises a soft magnetic media with a series of magnetic tunnel junctions (MTJs) 17 utilized as the readers. In contrast to present magnetic memory technology, in which the media provides the field detected by the reader, an external magnet or coil provides a "probe" magnetic field and the soft magnetic media modifies this field. Thus, for optimization, the magnetic field and media can be separately selected to optimize performance. Different widths of high permeability permalloy lines, which may, for example, be 0.434 microns wide and 2500 microns long, may be sputtered onto a 1200 micron thick optical grade soda lime substrate of low permeability ($\mu_r$~1) or other low permeability substrate. These lines consist of six alternating layers of 70 nm permalloy ($Ni_{80}Fe_{20}$) and 2.25 nm Cr. The layers can be sputtered in a magnetron sputtering system, with a working Ar gas pressure under 10 m Torr and a bias of −100 V at the substrate. These conditions reduce intrinsic stress in the thin film and result in low coercivities (~0.1 Oe) and high permeabilities ($\mu_r$~1000). E-beam lithography was employed to pattern the lines on the glass. The experimental setup for reading is shown in FIG. 16. A probe field is either unchanged by the glass 14 or modified by the permeability of the permalloy 15. The reader may be placed on the movable stage of a microscope 13, as shown in FIG. 16, which may be for example, a VHX-1000 Keyence. The substrate (comprising glass 14 upon which the media, for example permalloy 15, is deposited) is held parallel to the plane of the reader and is located between it and the lens of the microscope. The separation between the glass 14 and the reader 17, defined as the fly height, can be varied between 0 and 100 microns. A schematic view of the media and reader, as seen through the microscope, is shown in FIG. 2. FIG. 2 is a schematic illustration of the view through microscope at 500× magnification of permalloy stripes 158 and Magnetic Tunnel Junction (MTJ) reader chain 17. At a constant fly height, the moveable stage was used to manually translate the reader under the stationary media. The method of measurement has the advantage that one can visually correlate positions of the reader and media to changes in the detected field due to the media's permeability.

The changes in field were determined by the tunneling magnetoresistance (TMR) in the MTJs at a constant current of 1 mA and a sampling rate of 1000 Hz. There are 10 serially connected 40×10 micron MTJ ellipses in the reader. The magnetic sense direction of these MTJs is in the plane of the glass and perpendicular to their major axis, which is in the same direction as the MTJ chain. MTJ stacks were deposited onto a thermally oxidized silicon substrate in a magnetron sputtering system with a base pressure below 1 microtorr. Each magnetic tunnel junction (MTJ) reader 115 shown in FIGS. 3A and 3B may comprise nm-thick layers of $Ta(5)/Ru(20)/IrMn(5)/Co_{50}Fe_{50}(4)/Ru(0.8)/Co_{40}Fe_{40}B_{20}(3.5)/MgO(2)/Co_{20}Fe_{60}B_{20}(1.8)/NiFeCuMo(50)/Cu(10)$.
The two layers immediately above the MgO insulator 130 comprise the free layer 125, and electrode 155. There are three layers (not shown) below fixed layer 135 that constitute the synthetic antiferromagnetic (SAF) reference layer that is used to pin the direction of the magnetization in the fixed layer. See in this regard S. H. Liou, et al., Magnetics, IEEE Transactions on, 2011. 47(10): p. 3740-3743, hereby incorporated by reference.

Figure 11:
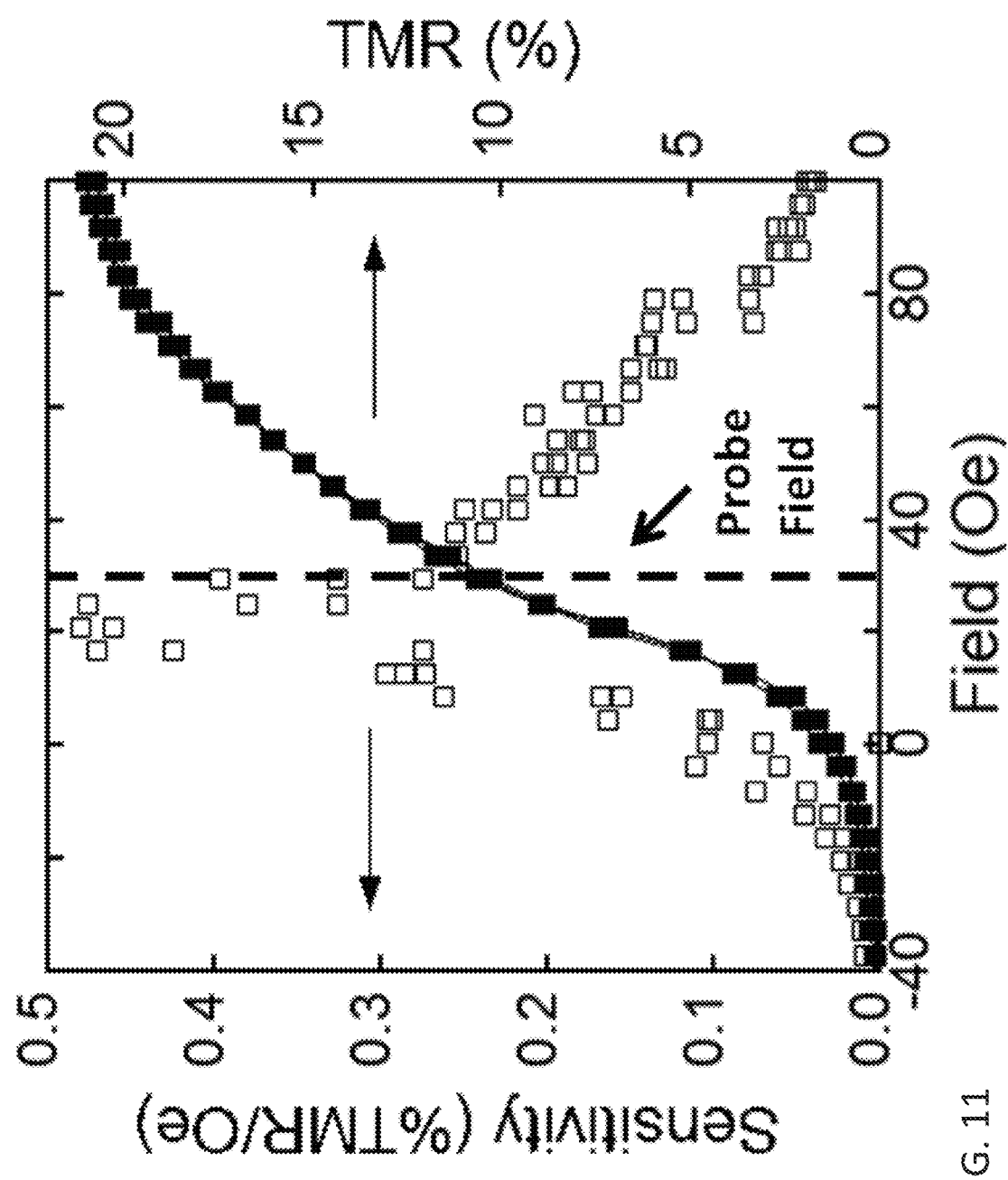
FIG. 11 is an illustration showing the percentage tunneling magnetoresistance change (ΔTMR) and sensitivity of a magnetic tunnel junction as a function of the magnetic field.

As seen in FIG. 11, the reader MTJ chain 17, for example, has a maximum tunneling magnetoresistance (TMR) of 22% and a maximum sensitivity of 0.48%/Oe in a field of 22 Oe. The reason that the maximum sensitivity is shifted from zero field has been attributed to roughness of the films and edge effects on each MTJ giving rise to stray fields from the reference layer, as described further in S. Ikeda, J, et al., Electron Devices, IEEE Transactions on, 2007. 54(5): p. 991-1002. The permanent magnet provides a probe field of 32 Oe in the sense direction of each MTJ in the chain 17, which results in a tunneling magnetoresistance (TMR) change of 11% and sensitivity of 0.32%/Oe with no media present.

Figure 3A:
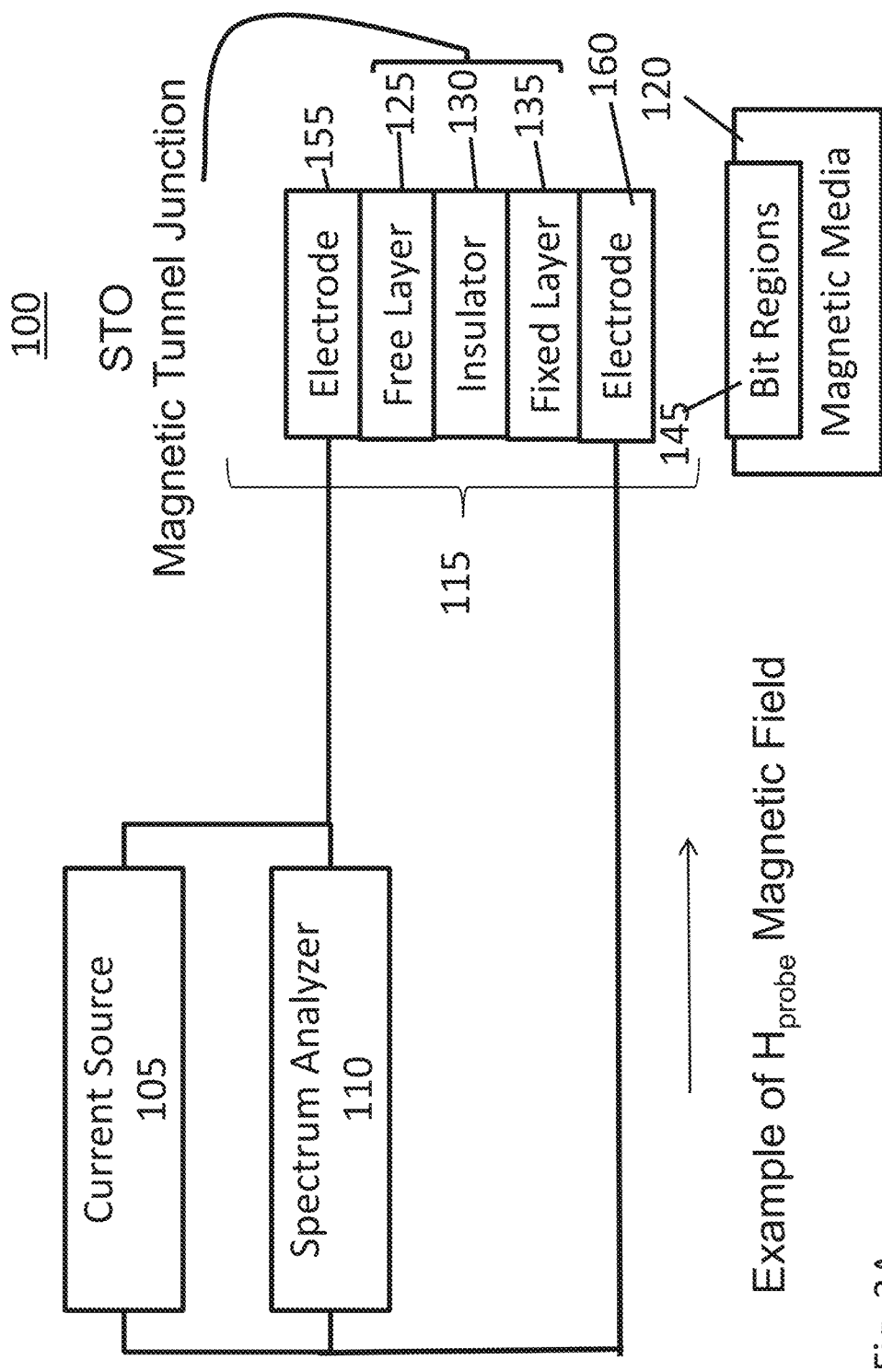
FIG. 3A is a schematic illustration of an exemplary preferred embodiment of the present invention using a spin torque oscillator a spectrum analyzer to read magnetic media. Alternately, the spin torque oscillator could be a spin valve instead of a magnetic tunnel junction reader.

Referring again to FIGS. 3A and 3B shown in block diagram form is an illustration of an exemplary embodiment of the present invention using a spin torque oscillator and a spectrum analyzer to read magnetic media. As an alternative the spin transfer oscillator can be a spin valve in which the oxide in the magnetic tunnel junctions is replace by a non-magnetic conductor. As shown in FIG. 3A, a reader 100 comprises a magnetic field source, a constant current source 105, spectrum analyzer 110, spin torque oscillator (STO) 115, and magnetic media 120. The constant current source 105, spectrum analyzer 110, and STO 115 are electrically connected in parallel. Permeable material changes the effective field at the position of the sensor which then changes the precession frequency of the STO. The precession frequency is measured as the frequency of the microwave voltage by the spectrum analyzer.

Figure 29:
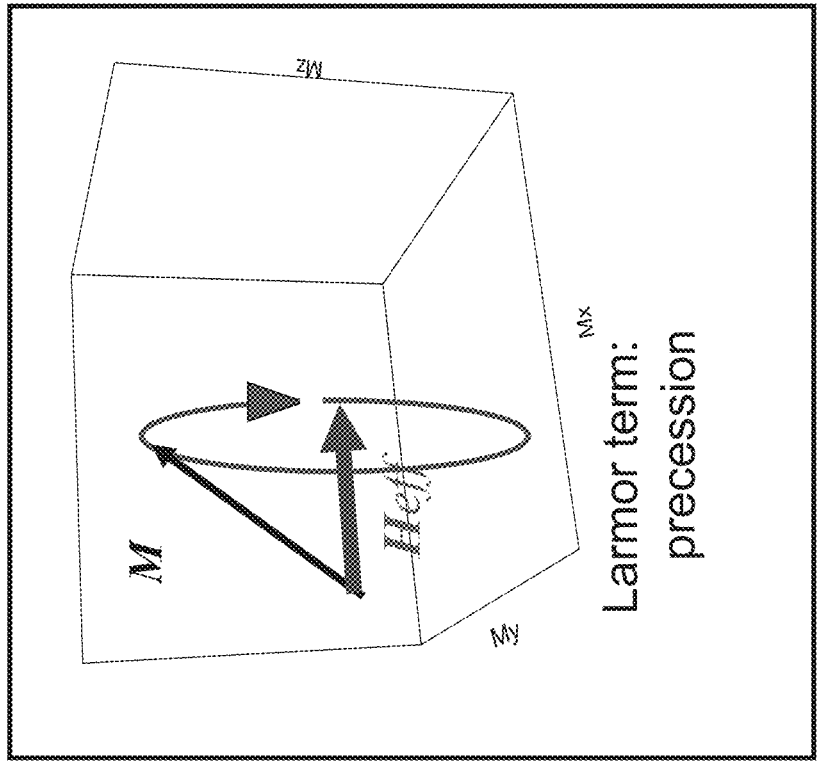
FIG. 29 diagrammatically illustrates the precession of the magnetization of the free layer in a spin torque oscillator (STO).
Figure 30:
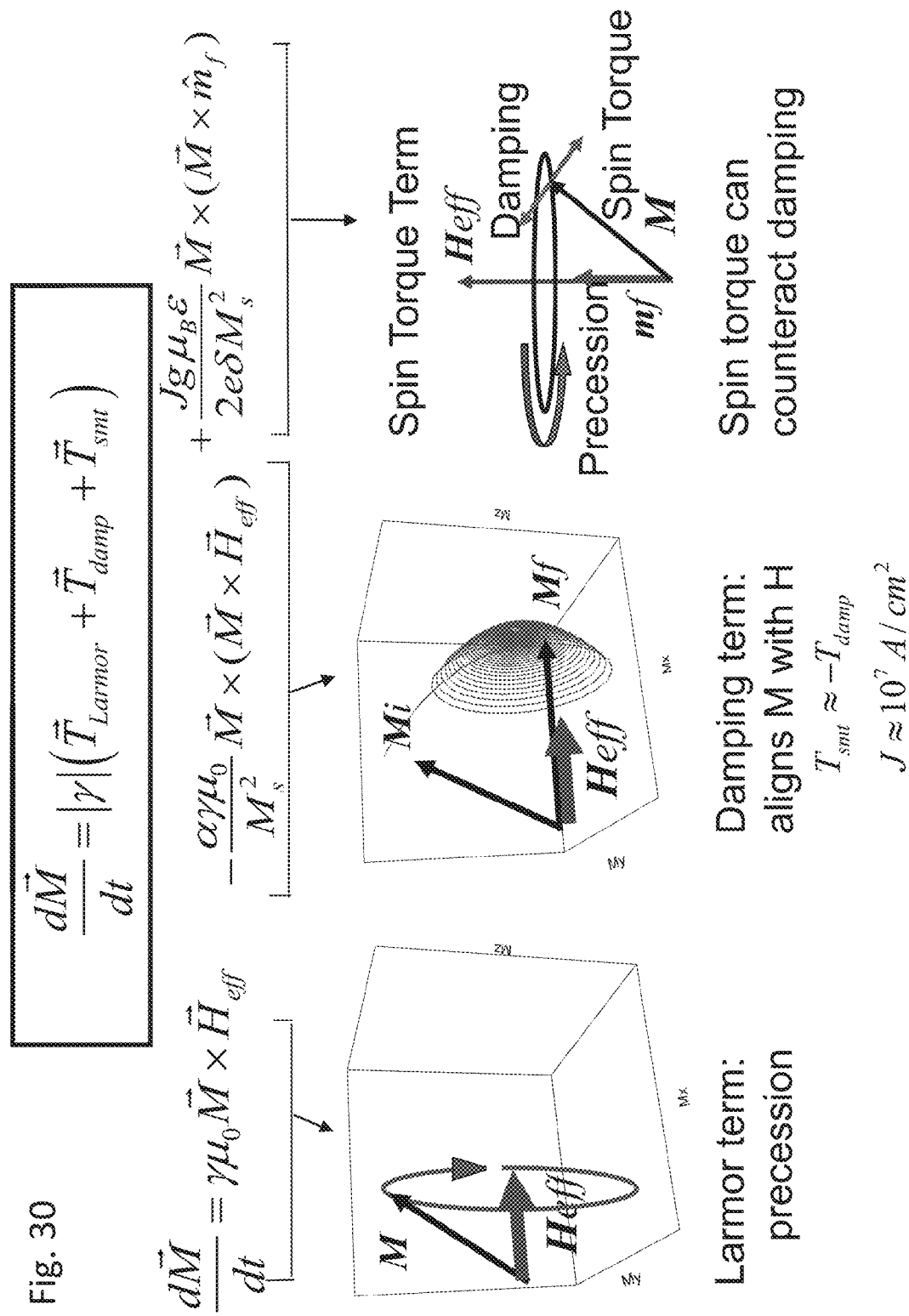
FIG. 30 diagrammatically illustrates how the magnetization changes in time. One of the factors affecting the magnetization is the torque provided by the spin polarized current. This torque can balances the relaxation torque so that the magnetization processes in a spin torque oscillator (STO) as postulated by Slonczewski in 1996.

According to Wikipedia, the spin-transfer torque is an effect in which the orientation of a magnetic layer in a magnetic tunnel junction or spin valve can be modified using a spin-polarized current. Charge carriers (such as electrons) have a property known as spin which is a unique quantity of angular momentum intrinsic to the carrier. An electrical current is generally unpolarized (consisting of 50% spin-up and 50% spin-down electrons); a spin polarized current is one with more electrons of either spin. By passing a current through a thick magnetic layer, one can produce a spin-polarized current. If a spin-polarized current is directed into a magnetic layer, angular momentum can be transferred to the layer, changing its orientation. This can be used to excite oscillations or even flip the orientation of the magnet. The effects are only seen in nanometer scale devices because of the need to have a high spin polarized current density. Spin transfer torque is illustrated in FIGS. 29 and 30. Further according to Wikipedia, spin-transfer torque can be used to flip the active elements in the conventional magnetic random-access memory. Spin-transfer torque random-access memory, or STT-RAM, has the advantages of lower power consumption and better scalability over conventional magnetoresistive random-access memory (MRAM) which uses magnetic fields to flip the active elements. Spin-transfer torque technology has the potential to make possible MRAM devices combining low current requirements and reduced cost.

Unlike conventional memory construction, the preferred embodiment of the present invention utilizes the property of magnetic permeability to distinguish binary bits. The bits are read with a spin transfer oscillator that uses spin transfer torque to balance the effect of damping or read with some other magnetic sensor such as a magnetic tunnel junction.

Figure 9:
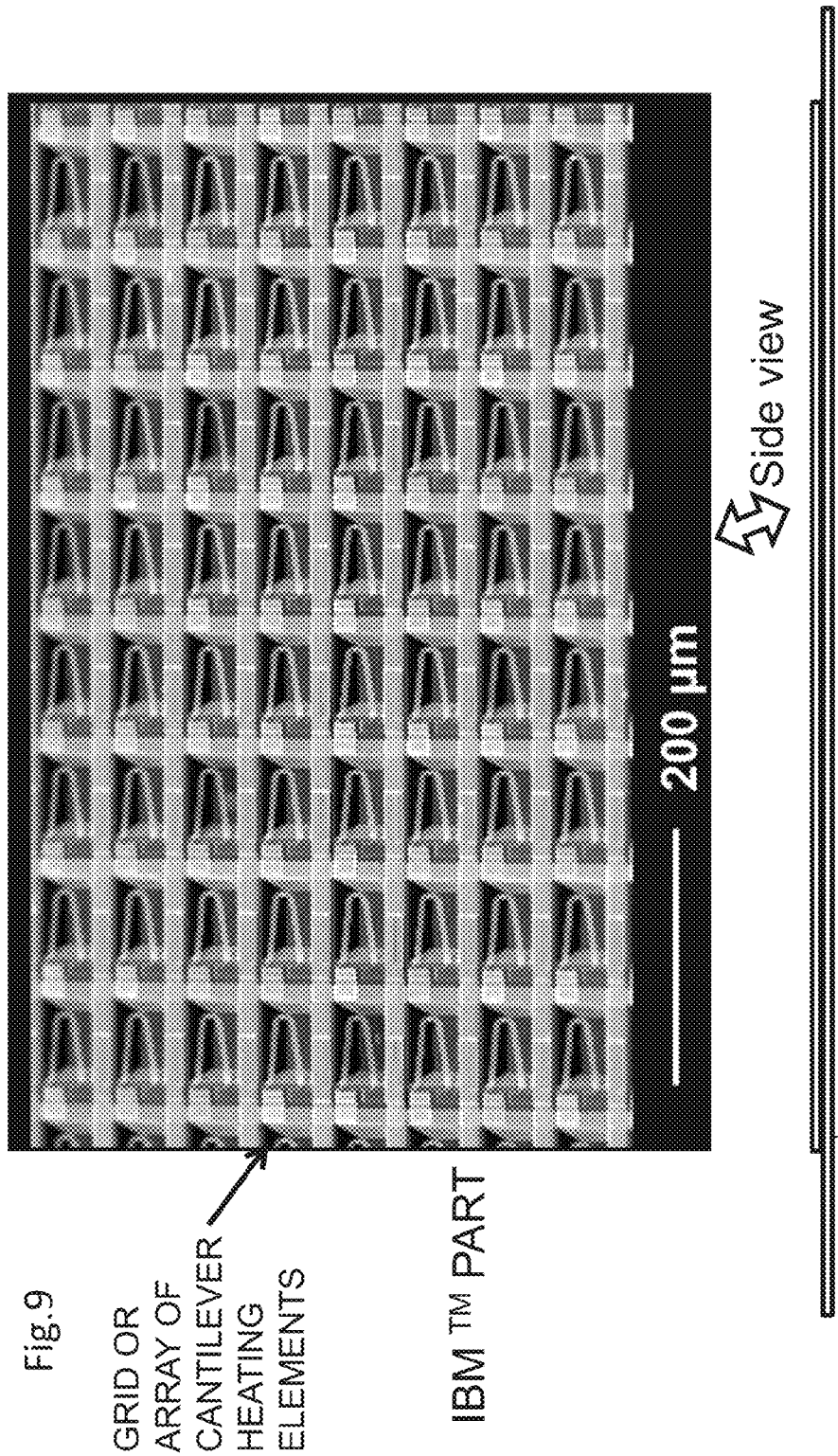
FIG. 9 is a picture of prior art of a heated cantilever Array.

The STO 115 in FIG. 3A is positioned to hover proximate the magnetic media 120. The media 120 is comprised of first portions or bit regions 145 having a stable, nonvolatile state namely its magnetic permeability in a material such as Permalloy or Metglas. Metglas for example, may be written by laser heating such that cooling rates determine whether a bit region has a high (rapidly cooled, amorphous state) or low permeability (less rapidly cooled, crystalline state). The laser produces two distinct permeability regions on the Metglas that represent 1's and 0's. The resultant bit data may be permanent provided the Metglas is not exposed to high heat (i.e. in excess of 400° C.). The bit regions 145 may be radially aligned or arranged as a grid for accurately locating and reading the individual regions 145 of the media 120. FIG. 9 is a schematic illustration of a grid or array of cantilever heating elements. When the tips of the cantilevers are hot, they can be utilized to write bits into a medium such as Metglas. Instead of the tips on the cantilevers, lasers may be focused in an array similar to the array of cantilevers. In FIGS. 3A and 3B, the spin transfer oscillator (STO) 115 (also known as a spin transfer torque microwave oscillator) can contain either a spin valve or a magnetic tunnel junction. If it contains a magnetic tunnel junction, it is comprised of a top electrode 155, a magnetic free layer 125, a non-magnetic layer 130, a magnetic pinned/fixed layer 135, and a lower electrode 160. Often an artificial antiferromagnet (not shown) is used to pin the magnetization of the fixed layer. A current is passed from the current source 105 through the STO 115 electrodes (155 and 160) such that spin polarized current passes through the insulator 130. The magnetic moment of the free layer 125 is in the plane parallel to the non-magnetic layer 130. Some embodiments may be comprised of a non magnetic insulator material such as Magnesium Oxide (MgO) or Aluminum Oxide ($Al_2O_3$).

In the combination of the fixed layer 135, insulator 130, and free layer 125 known as a magnetic tunnel junction, the non-magnetic layer or insulator layer 130 acts as a spacer to magnetically decouple the free layer 125 and the pinned layer 135. The structure of the STO 115 thus leaves the magnetic torque of the free layer 125 to rotate in response to external magnetic fields or the torque provided by a spin polarized current.

According to Wikipedia, the tunnel magnetoresistance (TMR) is a magnetoresistive effect that occurs in a magnetic tunnel junction (MTJ), which is a component consisting of two ferromagnets separated by a thin insulator. If the insulating layer is thin enough (typically a few nanometers), electrons can tunnel from one ferromagnet into the other. Generally, thin film technology or film deposition forms the magnetic tunnel junction, which is accomplished by magnetron sputter deposition, molecular beam epitaxy, pulsed laser deposition or electron beam physical vapor deposition. The direction of the two magnetizations of the ferromagnetic films can be switched individually by an external magnetic field. If the magnetizations are in a parallel orientation it is more likely that electrons will tunnel through the insulating film than if they are in the oppositional (antiparallel) orientation. The magnetic field that determines the orientations of the two layers can be altered by the at least one second portions of high permeability.

Consequently, such a junction can be switched between two states of electrical resistance, one with low and one with higher resistance which in effect measures whether the sensor is in close proximity to either a region of low permeability or high permeability.

In an STO, electrons driven from the pinned layer causes electrons to orient with the field of the pinned layer, then electrons interact with the free layer 125 to cause the magnetization of the free layer 125 to tend to align parallel with the magnetization of the pinned layer 135 (i.e. torque is transferred to the free layer). If the current direction is reversed the magnetization of the free layer 125 tends to align antiparallel with the magnetization of the fixed layer 135. This torque transfer can prevent the magnetization of the free layer from relaxing and aligning parallel with the magnetic field. This causes the magnetization of the free layer 125 to precess around the direction of the magnetic field and radiate microwave energy at the Larmor frequency that is proportional to the vector cross product $\vec{M} \times \vec{H}$ where $\vec{M}$ is the magnetization of the free layer and $\vec{H}$ is the effective field acting on the magnetization of the free layer.

The current density driving the STO 115 must be very high (e.g. $10^7$ amps/cm$^2$) and be spin polarized. The motion of the free layer 125 is governed by the Landau-Lifshitze-Gilbert (LLG) equation that includes the spin-transfer torque term:

$$\frac{\partial \vec{M}}{\partial t} = -\gamma \vec{M} \times \vec{H}_{eff} + \alpha \vec{M} \times \frac{\partial \vec{M}}{\partial t} - b_j \vec{M} \times \left( \vec{M} \times \frac{\partial \vec{M}}{\partial x} \right) \quad (1)$$

In equation (1), $\vec{M}$ is the magnetic moment. $\vec{H}_{eff}$ is the effective magnetic field (whether from the pinned layer or from an external source such as the magnetic media or probe field) and includes the anisotropy field, magnetostatic field, and exchange field. $\gamma$ is the gyromagnetic ratio, x is the direction of current flow and $\alpha$ is a constant which determines the relaxation rate. The quantity $b_j$ is given by $$b_j = P j_e \mu_B / e M_s \quad (2)$$

where P is the spin polarization of the current, $\mu_B$ is the Bohr magnetron, $j_e$ is the electric current density, and $M_s$ is the saturation magnetization value of M.

The first term on the right hand side of the equation (i.e. $-\gamma \vec{M} \times \vec{H}_{eff}$) gives rise to the precession and the second term $$\left(\text{i.e.}: \alpha \vec{M} \times \frac{\partial \vec{M}}{\partial t}\right)$$

is responsible for the relaxation of the magnetization. The third term in Eq. 1 provides a torque that opposes the relaxation and keeps the magnetization of the free layer precessing at some angle relative to the effective field $\vec{H}_{eff}$. Note the dependence on the spin polarized current in this third term. The frequency of the microwave radiation is proportional to the magnitude of the effective magnetic field $\vec{H}_{eff}$. As will be discussed further below, if there is an external field, the effective magnetic field includes the fields from the other layers of the spin transfer oscillator and from the external field or probe field.

The high permeability regions change the effective magnetic field $\vec{H}_{eff}$. This in turn changes the frequency of the STO 115 microwaves such that there is a measurable change in the frequency detected by the spectrum analyzer 110. The change is due to the amount of permeability for a specific bit area/region on the media 120. The permeability of the media modifies the magnetic field $\vec{H}$ from equation (1) in that magnetic field lines are attracted into the regions of the media with high permeability. Depending of the geometry, i.e., the position of the high permeability regions in the media relative the STO 115 this can either increase or decrease the first term in Eq. 1. This will change the precession frequency. Since the STO 115 has a high quality factor (Q), small changes in the microwave radiation are easily detectable as shifts in this microwave precession frequency. The voltage across the STO may be directly measured with the spectrum analyzer 110 such that the change in the precession frequency is detected, or indirectly, the amplitude and the width of the resonance frequency change may be measured. Other embodiments may include an antenna to indirectly capture and couple the signal to the spectrum analyzer 110.

The magnetically permeable media 120 will modify the RF signal from the STO 115 in two ways. Firstly, the permeability will modify the magnetic field at the position of the STO 115 by modifying magnetic flux. Modifying the field will shift the precession frequency and hence also shift the frequency of the RF signal. Secondly, the media 120 will absorb microwave energy because of resistive losses. Since energy is absorbed into the media, this will affect the spin oscillation in the STO free layer and lower the Q.

As the reader 100 operates based on the magnetic permeability of the media 120, the memory is non-volatile as permeability is an intrinsic property. Lifetime integrity is also extended almost indefinitely, as the media 120 no longer needs to have a minimum energy for maintaining the magnetization direction that determines the bit value of the individual bit regions. Furthermore, since the reader 100 is not reliant on the magnetization direction of the regions, the media 120 is not limited by the super paramagnetic limit and may have greater bit density. Thus, in some exemplary embodiments, the reader 100 may read bits that are 20×20 nm or 400 nm$^2$ with a bit density of 2.5×10$^{11}$/cm$^2$. The bit values detected by the spectrum analyzer may then be output to a computer for additional processing of the information.

Figure 4:
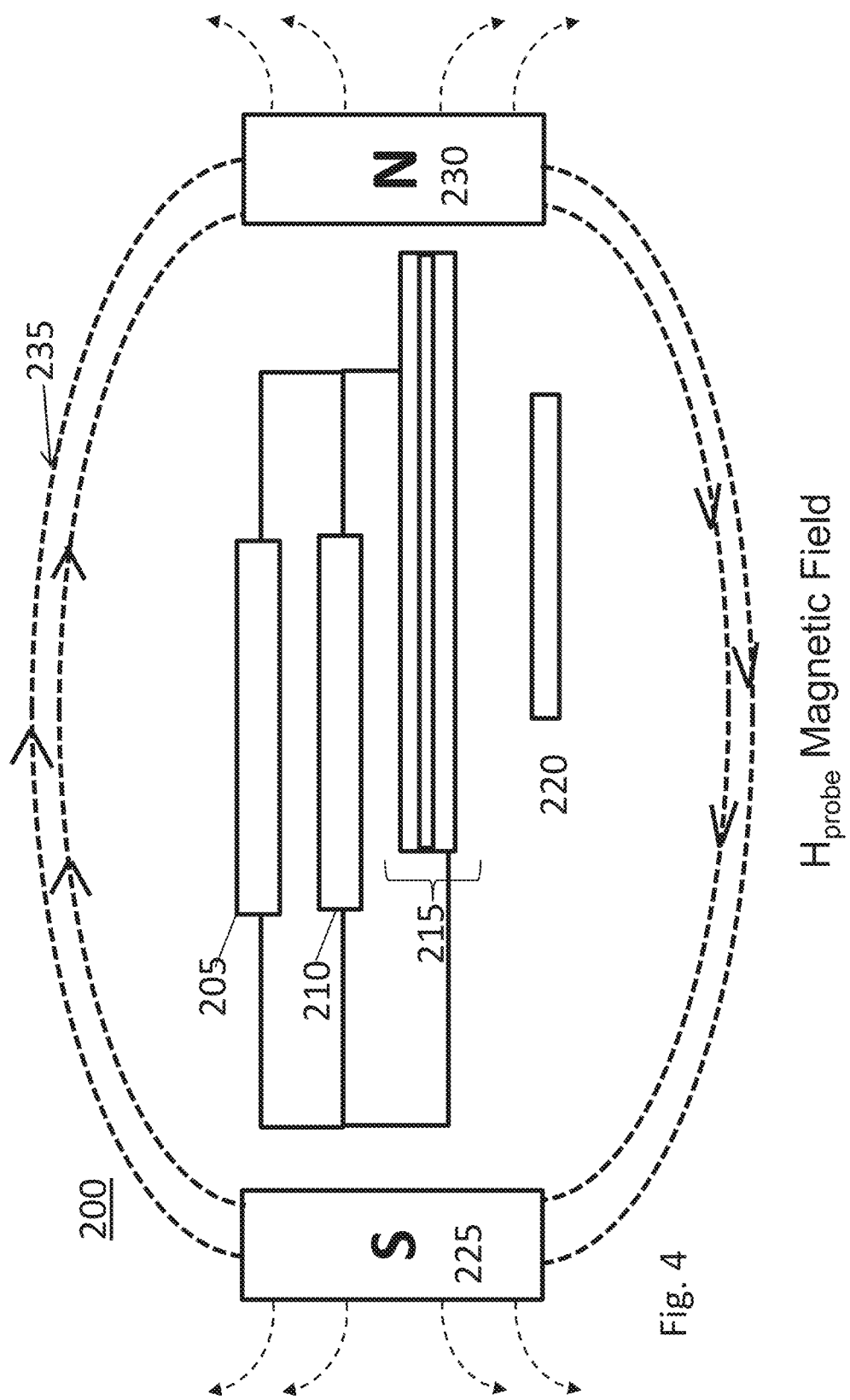
FIG. 4 is an illustration of an exemplary preferred embodiment of the present invention utilizing a spin transfer oscillator (STO) with a spectrum analyzer to read magnetic media while applying a magnetic field.

FIG. 4 is a schematic, diagrammatic illustration of an exemplary embodiment of the present invention utilizing an STO with a spectrum analyzer to read magnetic media while applying a magnetic field. The reader 200 comprises a constant current source 205, spectrum analyzer 210, STO 215, media 220, and permanent magnets (shown as 225 and 230). The spectrum analyzer 210 and STO 215 are electrically connected in parallel and the STO is positioned to hover above the media 220. The reader 200 uses permanent magnets (225 and 230) to supply the external magnetic field that will result in a desired microwave precession frequency region where the STO has its maximum sensitivity to magnetic field changes. Further embodiments may replace the permanent magnet(s) (225 and 230) with electromagnet(s).

The addition of the permanent magnets (225 and 230) allows for improved freedom to tailor the STO 215 for particular media 220 by modifying the frequency of the microwave radiation from the STO 215. The frequency modification may also allow using the maximum sensitivity of instruments such as the spectrum analyzer 210. FIG. 4 depicts the exemplary embodiment, including placing permanent magnets (225 and 230) of opposite polarity on either side of the STO 215 and allowing the magnetic field 235 to change the microwave frequency emitted by the STO 215 and measured by the spectrum analyzer 210. Further embodiments may use one permanent magnet or multiple magnets or electromagnets to create an external magnetic field 235 and may be proximately located to the STO 215 as necessary to alter the microwave radiation from the STO 215.

Figure 5:
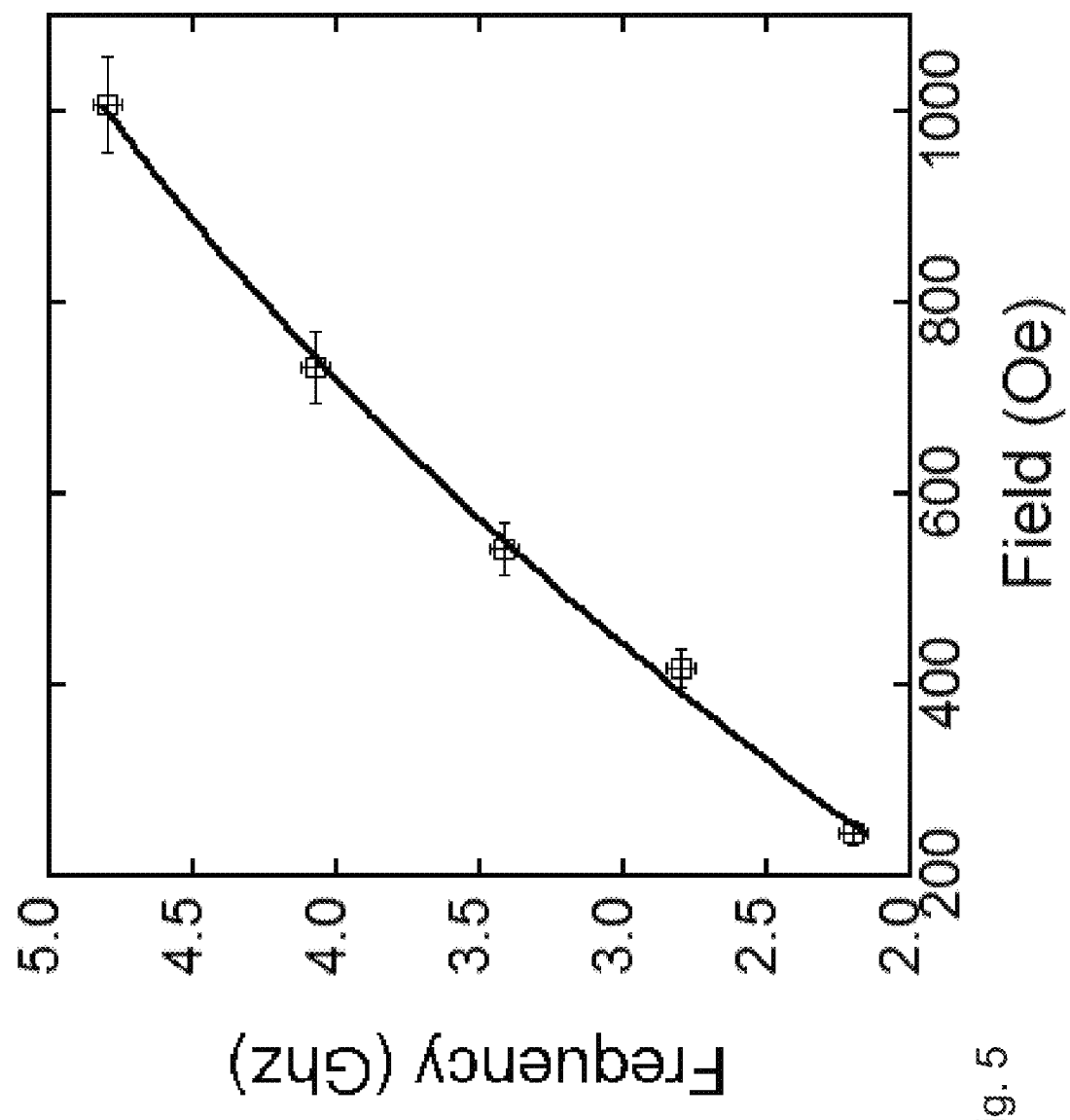
FIG. 5 shows how the frequency of a spin transfer oscillator (STO) varies as a function of an applied external field.

FIG. 5 is a graph of an exemplary emitted microwave precession frequency shift of an STO 215 at different external magnetic field strengths. The field is varied by changing the separation distance between the permanent magnets (225 and 320). The large shift in the frequency due to the permanent magnets allows the STO 215 to operate at varying frequencies without having to include additional electronics for controlling the STO 215.

Figure 6:
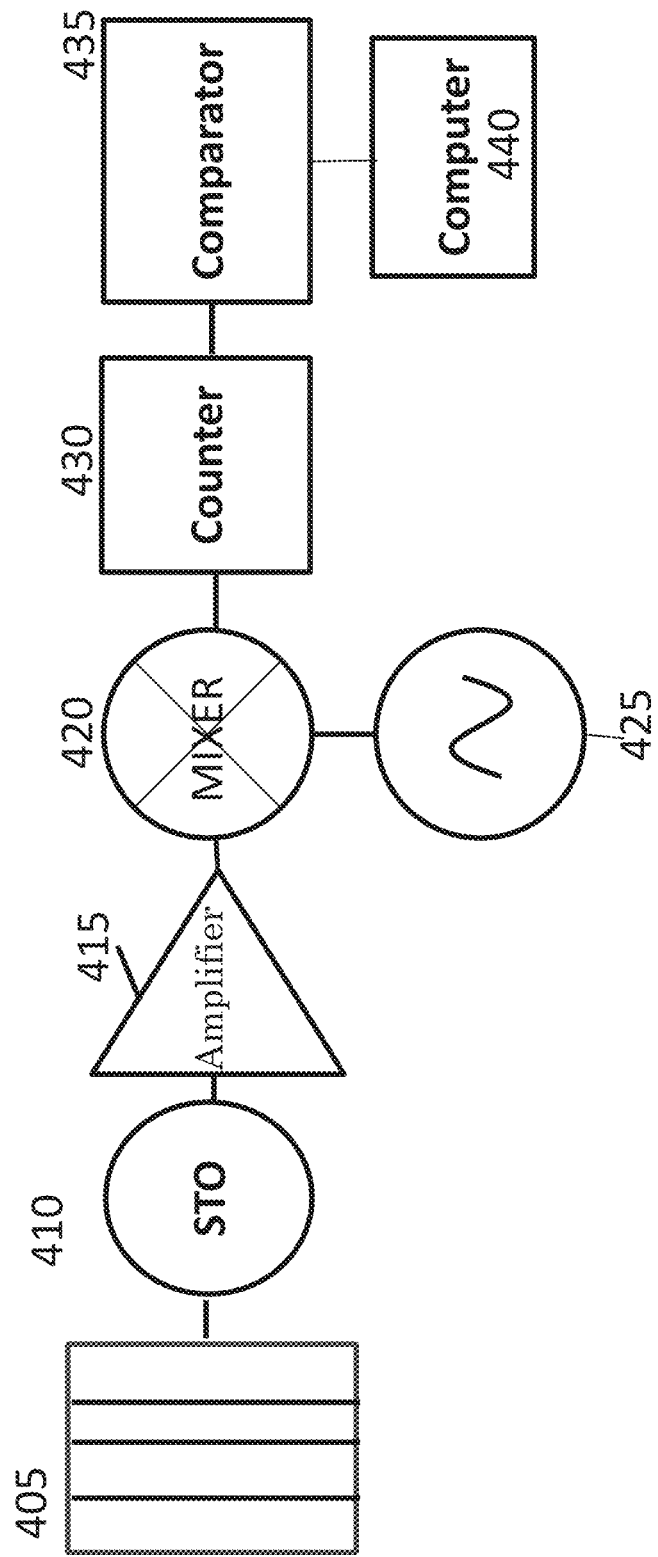
FIG. 6 is a schematic of an exemplary embodiment utilizing a super heterodyne receiver and a spin transfer oscillator (STO) to read magnetic media.

FIG. 6 is a schematic of an exemplary embodiment of the present invention utilizing a super heterodyne receiver and an STO to read magnetic media. The reader system 400 comprises bit memory regions of magnetic media 405, a STO 410, an external magnetic field of 300-900 Oe, an amplifier 415, a mixer 420, a filter 428 (not shown), a local oscillator 425, a counter 430, a comparator 435, and a computer 440. A super heterodyne receiver comprises amplifier 415, mixer 420, filter 428, and oscillator 425. Bit regions 405 are positioned in close proximity to the STO 410. A microwave signal is emitted from the STO 410. The resulting signal from the STO is coupled to an amplifier 415 such as a low noise amplifier (LNA). The amplifier sends the signal to a mixer 420 that is down-converted with a local oscillator 425, which may be used as a reference oscillator and set to a frequency within megahertz of the STO with no media present. The difference frequency ($\Delta f$) is outputted from the mixer 420. The mixing is necessary as the STO 410 resonates at such a high frequency, that sampling it directly with a spectrum analyzer would be difficult and/or time consuming. The local oscillator 425 provides an RF signal near the unshifted frequency of the STO such that output frequency of the mixer is in the MHz range. The mixer output is filtered by the filter 428 (not shown) to remove side bands. The resultant signal from the filter 428, is then able to be directly measured by the frequency counter 430 (which determines the RF frequency).

The frequency counter digitizes the resulting IF signal for the threshold comparator 435. The comparator 435 compares the outputted Δf output with some accepted value; for example, the predefined accept value may be determined based upon whether the shift frequency is greater than one-half the expected Δf. The comparator 435 applies predetermined known criteria for anticipated frequency shift values for a high or low permeability bit. The results of the high or low bits (i.e. "1" or "0") are then output for processing by a computer 440 comprising a CPU, memory, A/D converters, D/A converters, and digital signal processing ultimately leading to a user interface. Further embodiments may include the measured change in the frequency response as a change in quality factor, gain, or impedance matching.

FIG. 7A depicts an exemplary flow diagram to determine bit values of the read media. The method 500 begins at step 505 and aligns a STO above magnetic media at step 510. For example, the STO may be aligned above media at first location to determine whether or not bit is present and if so, the value. In some embodiments, the alignment may be achieved through the STO mounted on a mechanical arm suspended over a rotating media disk. A current is then passed through the STO at step 515 such that the STO radiates an RF signal. The frequency of radiation will change if the effective magnetic field acting on the free layer is changed by high magnetic permeability bits to be measured at step 520. The measurement from step 520 is then compared according to predetermined criterion to determine the bit value at step 525.

The criterion includes a threshold for a "1" bit value at step 530, which if returned true, flags the bit location as a "1". The method then determines if there are more bits to be read at step 555, which if true proceeds 565 back to align the STO with the next bit in the media or else the method ends 560. However, if at step 530 it is determined the "1" bit value threshold is not met; the method determines whether the threshold for the bit value is a "0" at step 535. Should the threshold for bit "0" be met, the bit location is accordingly flagged 545 as a "0" and the method continues to determine if more bits are to be read at step 555. However, if step 535 determines the threshold for the "0" bit value is not met the method ends 540 as an error or inconclusive reading. One of ordinary skill in the art would know of a variety of methods for dealing with this situation. For example, the cycle could be repeated and if the threshold still is not met, a determination of the value of the bit might be deduced from the context of information about neighboring bits. An alternative would be planned redundancy, in crucial places, where bits are essentially duplicated. Error correcting methods could also be used. In an exemplary embodiment, wherein the frequency response is measured, the measured frequency shift is compared 525 with predetermined frequency criterion for bit values. As an example, a "1" is where $|\Delta f|>|\Delta f_1/2|$ and "0" is $|\Delta f|\cong 0$, where $\Delta f_1$ is the preset expected value for the high penneability bit.

Figure 7B:
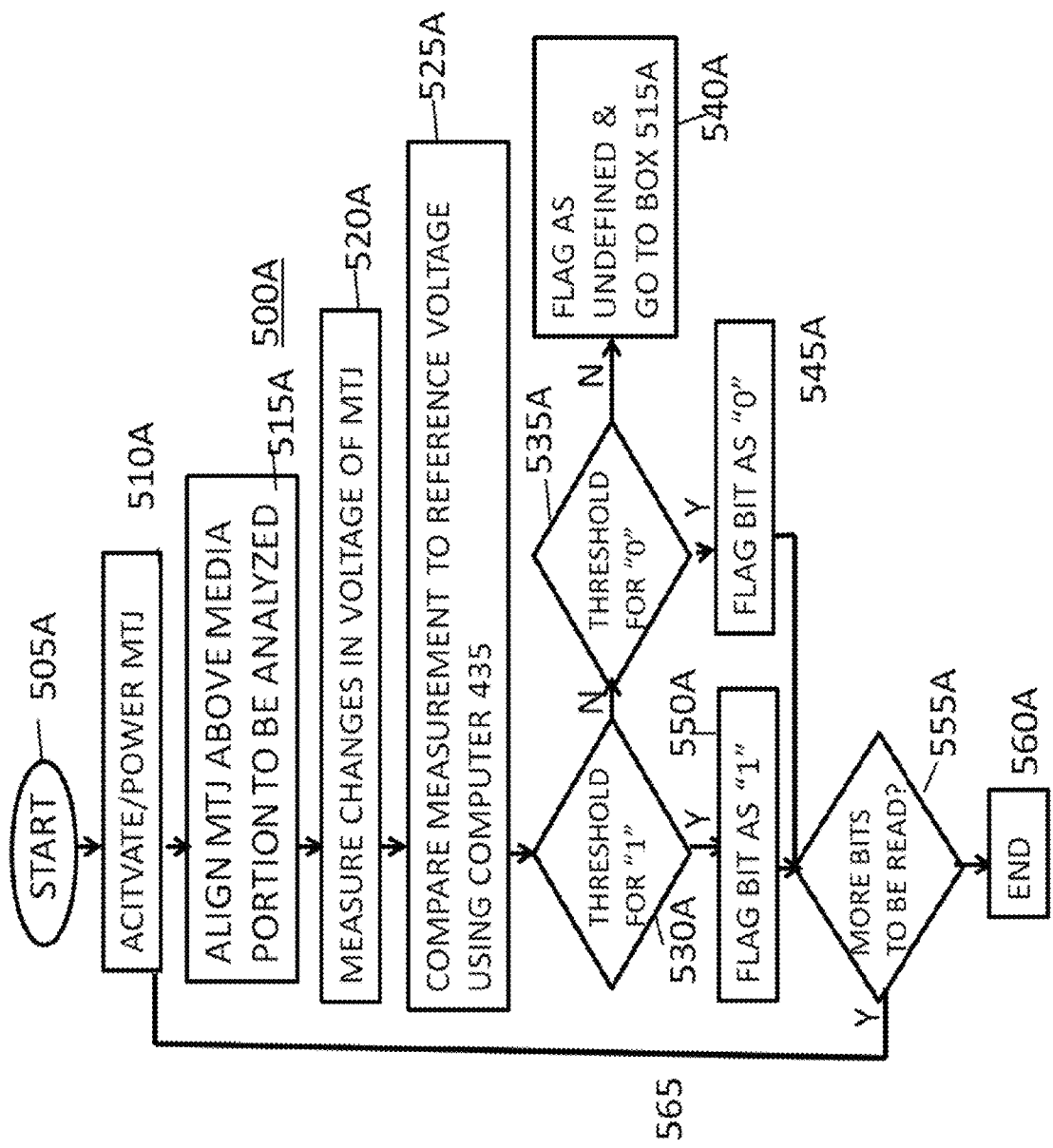
FIG. 7B depicts an exemplary flow diagram to determine bit values of the read media using a magnetic tunnel junction (MTJ) reader.

FIG. 7B is a flow chart similar in nature to FIG. 7A except that in FIG. 7B, the change in voltage across an MTJ in series with a constant current source is being measured in box 520A and the comparison is made with respect to a reference voltage in box 525A.

Figure 8:
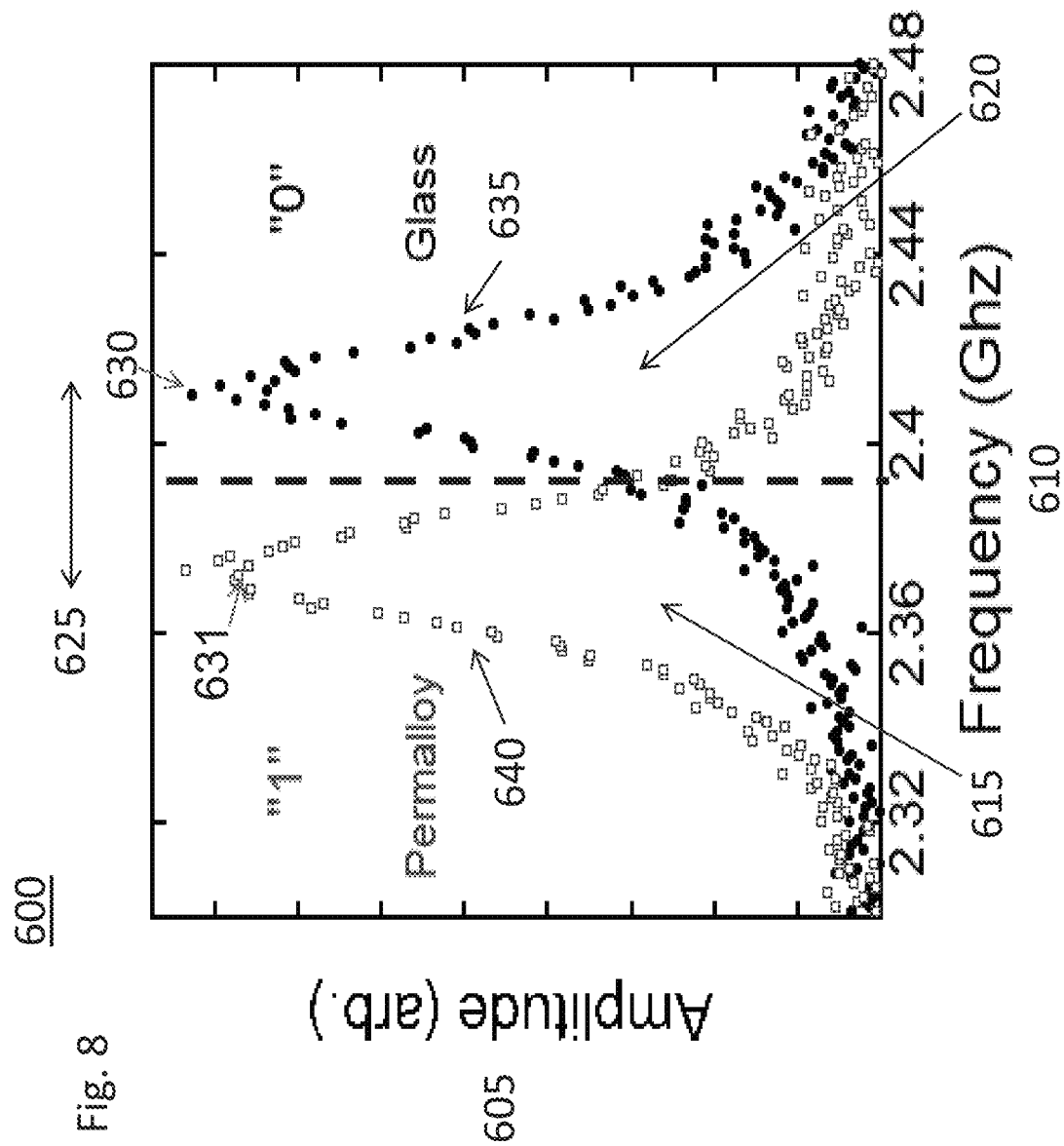
FIG. 8 is a graph of an exemplary comparison threshold applied in FIGS. 6 and 7A.

FIG. 8 is a graph 600 of an exemplary comparison threshold applied in FIGS. 6 and 7A. The graph 600 plots the amplitude 605 of the resultant signal from the STO versus frequency 610. The curve to the right depicts the output signal from the STO criterion for "0". Note that the center frequency is held at approximately 2.42 GHz for a known low permeability bit. The curve to the left depicts the criterion for the "1" bit value such that the center frequency 631 is held approximately at 2.37 GHz. Following the criteria above, if it is determined that a frequency change 625 that is more than half the difference of preset expected value 630 minus the present value 631 of the high permeability bit, the bit is a "1". Also following the criteria above, if the frequency change 625 is near zero, the bit value remains "0". In this embodiment, the high permeability bit state 640 is held to be a "1" and the low permeability bit state 640 is held to be a "0". However, further embodiments may reverse this bit classification such that the low permeability is held as a "1".

Other, further embodiments may include rewritable media such as the ferromagnetic class of alloys known as Metglas. Metglas is a material that has a high magnetic permeability of approximately 10,000 $N \cdot A^{-2}$ in the amorphous state and a low permeability of approximately 5-10 $N \cdot A^{-2}$ when it is crystalline. By controlling the cooling rate from above 800° C., that results from heating by, for example, using an e-beam or evanescent wave, it is possible to rewrite the media by making the material either crystalline or amorphous. The advantage of using an evanescent wave is that one can achieve higher density because the resolution is not limited by the wave length of the light. In optics, using geometric constraints electromagnetic waves are transmitted from one medium to another producing an evanescent, exponentially decaying electromagnetic field.

Other embodiments may include multiple levels that are based on corresponding levels of permeability and saturation. The multiple levels of permeability may thus also allow for more information to be stored per bit area and/or greater bit density. Nevertheless, the reader disclosed above utilizes intrinsic magnetic permeability and thus provides the ability to read magnetic media that is effectively immune from corruption by magnetic fields.

FIG. 9 is a schematic illustration of a prior art cantilever array used for heating made by International Business Machines, Inc. that can be positioned over used for heating a section of Metglas and used for controlling the crystalline phase of the Metglas.

Figure 10:
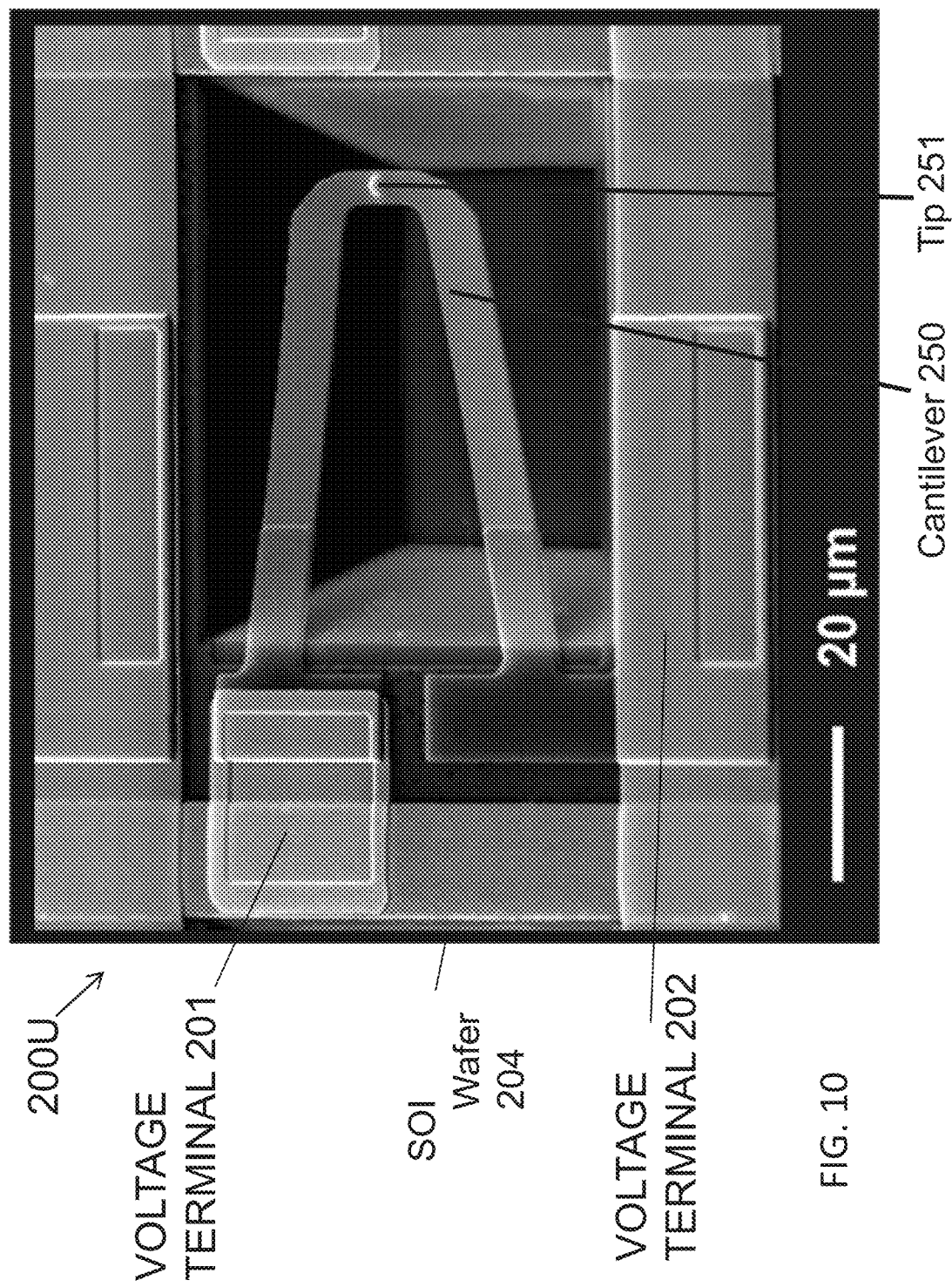
FIG. 10 is a picture of a prior art of one unit or section of the heated cantilever array used for writing.

FIG. 10 is a schematic illustration of one section or unit of a heated cantilever array made by International Business Machines, Inc. positioned over a section of Metglas (not shown). The unit 200U comprises a first and second voltage terminals 201 and 202 and a cantilever 250. The tip 251 of the cantilever may be doped differently than the rest of the cantilever so that the tip becomes hot and either touches or comes into close proximity with the media (Metglas). The Metglas is an amorphous material, and, when heated, crystallizes and forms regions of lower permeability. Thus, regions of lower permeability (bit regions) may be formed when the tip 251 engages or nears the Metglas. The use of the array illustrated in FIG. 9 recognizes the need to write bits on 100 nm or smaller scale. The heating with cantilever may be utilized on SOI wafers with the tip being doped differently than the rest of the cantilever. The FIG. 9 array may be used to form nano-scale data. The bit indents in polymer media (IBM) utilize millipede technology. This has been done by putting in the heated tips in contact with media. One may attempt to avoid contact and use preset temperature of heating the entire media of only 350° C. to minimize the amount of local temperature rise provided by the hot tip. Using similar mechanisms, to date, have made use of 0.2 μm×0.3 μm heaters. With other heaters, it has been possible to write on at a 10 nm scale. It is also possible to use lasers and joule heating to heat Metglas and write the bits.

FIG. 11 is an illustration showing the percentage tunneling magnetoresistance (TMR) of an MTJ reader chain in different magnetic field strengths. Tunneling magnetoresistance (TMR) and sensitivity for the MTJ reader chain is depicted. The black boxes show percentage changes in the tunneling magnetoresistance (TMR), while the hollow boxes show the sensitivity as a function of the field acting on the MTJ. Field shunting or enhancement at the reader is determined by respective negative or positive changes in the tunneling magnetoresistance (TMR).

Figure 12:
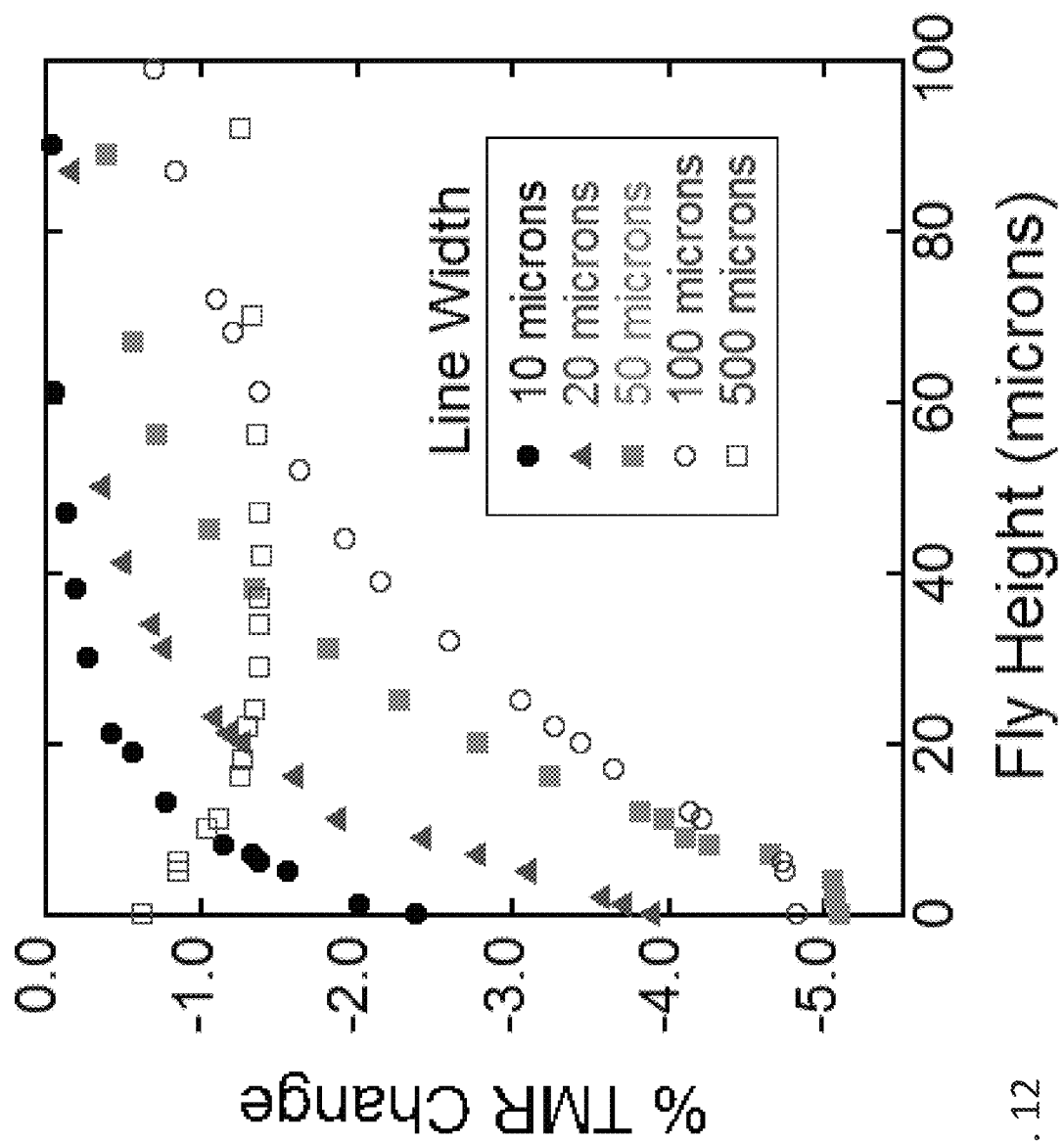
FIG. 12 is an illustration showing percentage change in tunneling magnetoresistance (TMR) versus fly height d for different widths w of a single permalloy line centered over the reader in a 32 Oe probe field. The change in tunneling magnetoresistance (TMR) increases with increasing w for w<100 microns and with decreasing d between the reader and permalloy for ds≤60 microns.

FIG. 12 graphically shows the percentage tunneling magnetoresistance change (ΔTMR) resulting from placing the reader directly under the center of a single permalloy line of varying width w at a By height d in a 32 Oe external probe field. Since the permalloy attracts magnetic flux, placing it in close proximity to the MTJs changes the external probe field at the position of the reader. For a 10 micron wide line, where the width of the line is comparable to the width of the reader, the ΔTMR has a maximum value of −2.5% at the minimum fly height separation. This result implies that 8 Oe is diverted away from the reader by the presence of the permalloy. Generally, at progressively larger widths, the shunting effect increases as more flux is diverted into the permalloy and away from the reader. The shunting effect reaches a maximum tunneling magnetoresistance change (ΔTMR) of −5% near a width of 100 microns, revealing that ~13.5 Oe, or over 40% of the probe field, is shunted. The shunting effect diminishes for widths much larger than 100 microns, as it becomes increasingly difficult to affect the magnetic flux near the center of the permalloy line where the reader is located. The minimum bit size is limited by the size of the reader, the fly height distance, the permeability of the soft magnet, and the sensitivity of the sensors. Modeling results using the finite element code MAXWELL 3D support this conclusion.

Figure 13:
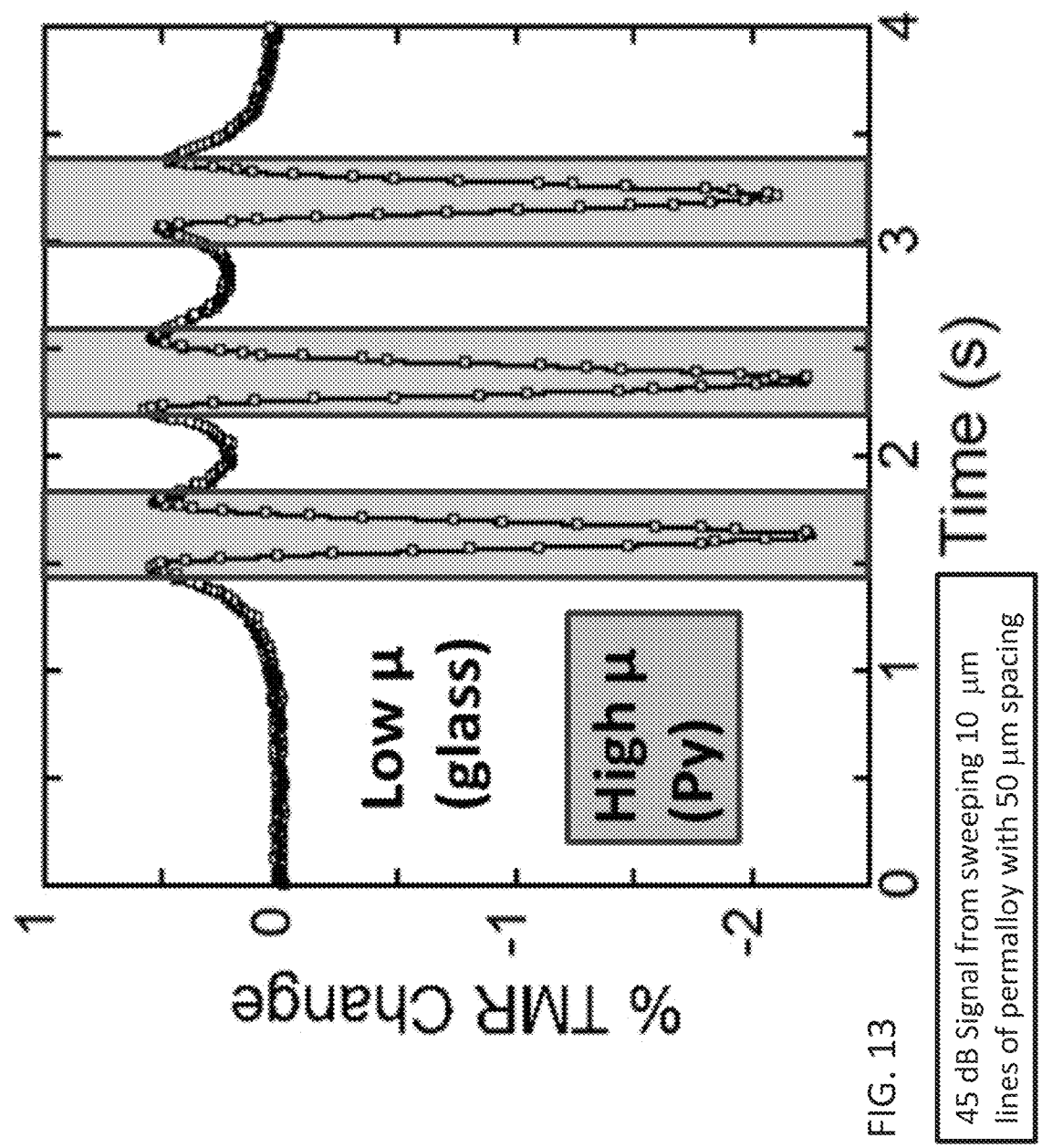
FIG. 13 illustrates the percentage change in tunneling magnetoresistance (TMR) resulting from sweeping the reader under three 10 micron wide lines of permalloy, with 50 micron separation between the lines, at a fly height d of 5 microns and a probe field of 32 Oe. Shaded regions indicate the time when reader was swept under the permalloy lines swept over reader. Ten percent of data points are included in the figure.

FIG. 13 shows the tunneling magnetoresistance change (ΔTMR) that results from sweeping the reader in a 32 Oe external field under the group of three lines (i.e. high permeability bits) shown in FIG. 2B with width w=10 microns, a lateral separation of 50 microns, and a fly height d=5 microns. The signal-to-noise ratio (SNR) for the tunneling magnetoresistance change (ΔTMR) valleys attributable to field shunting is ~45 dB. The small tunneling magnetoresistance change (ΔTMR) increase associated with a field enhancement around each valley occurs as the reader passes under the edge of each line and into the path of flux attracted by the permalloy. In another embodiment, the small peaks associated with these tunneling magnetoresistance (TMR) increases could also serve in bit detection.

In FIG. 14A, the reader is swept at approximately 3 Hz and 30 Hz under a group of three lines with w=50 microns, a lateral separation of 50 microns, and d=10 microns. The amplitude and signal to noise ratio (SNR) in both cases are comparable to situation depicted in FIG. 13 where the sweep rate was slower. The insensitivity to sweep rate indicates this approach has a scalability towards higher reading rates. FIG. 14B shows data taken using a similar ~3 Hz sweep both before and after the media was exposed to a large 6400 Oe field for 60 seconds. Such sweeps, of which the post-field scan is representative, were repeated multiple times with the 6400 Oe field at different orientations to the reader. Within experimental error, the amplitude and SNR is unchanged, indicating the non-erasability of the information in large magnetic fields.

In accordance with the above, one can read 10 micron wide non-erasable (or nonvolatile) magnetic lines and distinguish regions of high and low permeability with a SNR of 45 dB. In addition to showing that the read rate is capable of improvement, an increase in the SNR is expected to be obtainable by optimizing the performance of our MTJ readers. Since the lower limit on media size is determined by the reader dimensions and fly height, and not the thermal stability of the media, higher density media are not constrained by the super paramagnetic limit. Through the effect of shunting of flux across a gap in a magnetic circuit by a soft magnetic material, a reader can detect an enhancement of the probe field and thus sense the presence of soft ferromagnetic media, field in other configurations as reported in U.S. Pat. Nos. 5,186,854 and 7,233,142 to Edelstein, hereby incorporated by reference as though fully rewritten herein. In fact, any detectable change in the probe field magnitude and/opr direction due to differences in media permeability should suffice for the reading process. Finally, because e-beam writing is expensive, alternative methods for low cost recording/re-writing of media consisting of regions of high and low magnetic permeability may be utilized without departing from the scope of the invention. The ability to write as well as read such non-erasable (or nonvolatile) media can potentially fulfill the growing need to store both large and small amounts of data indefinitely.

Turning now to FIG. 15, a comparison of read heads is illustrated. In the left portion, the bit is determined by the direction of the magnetic field generated by the remanent magnetization in the bits of the media. This illustrates current magnetic memory technology that senses the direction of magnetic domain fields; an extrinsic property. The disadvantages include information can be erased by exposure to magnetic fields or radiation and thermal instability leading to superparamagnetism constraints on the density of information and storage lifetime (usually <7 years).

Shown to the right in FIG. 15 the non-erasable (or nonvolatile) magnetic memory of the preferred embodiment senses the modification of a probe field ($H_{probe}$) by the magnetic permeability (μ) of a soft ferromagnet; an intrinsic property. The advantages are that the storage is unaffected by magnetic fields or radiation, thermal instability does not lead to superparamagnetism constraints limiting information density and storage lifetime, and the probe field may be tailored to the read head/media.

Types of writing using preferred embodiments of the present invention include: (A) e-beam writing (optical lithography), which may be utilized in conjunction with a non-erasable (or nonvolatile) card system (10 μm capability) and has the potential for permanent archiving at 50 nm. (B) Thermal laser writing, which may be utilized in conjunction with a non-erasable card system (10 μm capability) and has the potential for permanent archiving at 50 nm or still smaller with less than 100 μsec. writing time. (C) Thermal hot tip, evanescent wave or ohmic heating writing, which has capability of writing on a 10 nm scale. (D) Thermal joule writing with an scanning tunneling microscope, which has the capability of writing at the 10 nm scale. The thermal writing can be aided by heating the all of the media so that the energy needed for writing individual bits is smaller. Thermal writing can also be performed using a laser and a near field transducer on a 10 nm scale. (E) Dip pen writing or magnetic ink jet writing, which has a potential for writing on a submicron scale. One can use an MTJ reader (20 nm) and STO reader with a read time of less than 20 μsec.

Thermal writing and reading with MTJ/STOs is applicable towards radiation hard DOD, space applications, magnetic swipe cards, and ID tagging. Archiving at current information density is expected for thermal writing with cantilevers (shown in FIG. 9) and MTJ/STO reading is very likely. Information written in this manner is intrinsically robust and difficult to tamper with or change.

FIG. 16 is a schematic illustration depicting an optical microscope 13 having a substrate 14 consisting of glass upon which a highly permeable media such as permalloy is deposited and read by reader 17 as described above.

Figure 17:
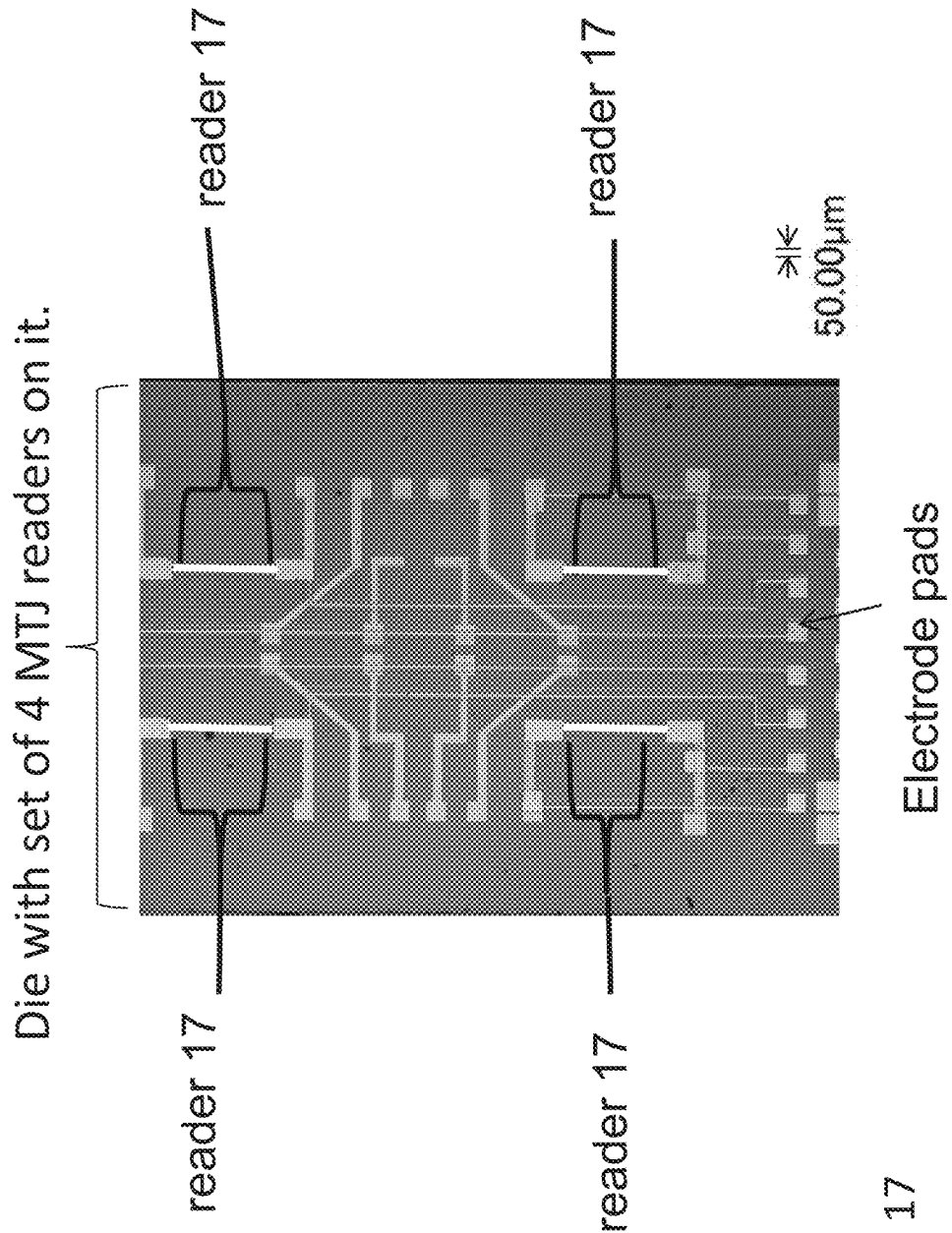
FIG. 17 shows a die with a set of four magnetic tunnel junction (MTJ) readers 17 thereon. Electrode leads run to one side of die (bottom in picture) so as to not affect wire bonding to electrode pads.

FIG. 17 is a schematic illustration depicting a die with a set of 4 MTJ readers 17 thereon. Electrode leads run to one side of die (bottom in picture) so wire bonding does not limit fly height separation between readers and media.

Figure 18:
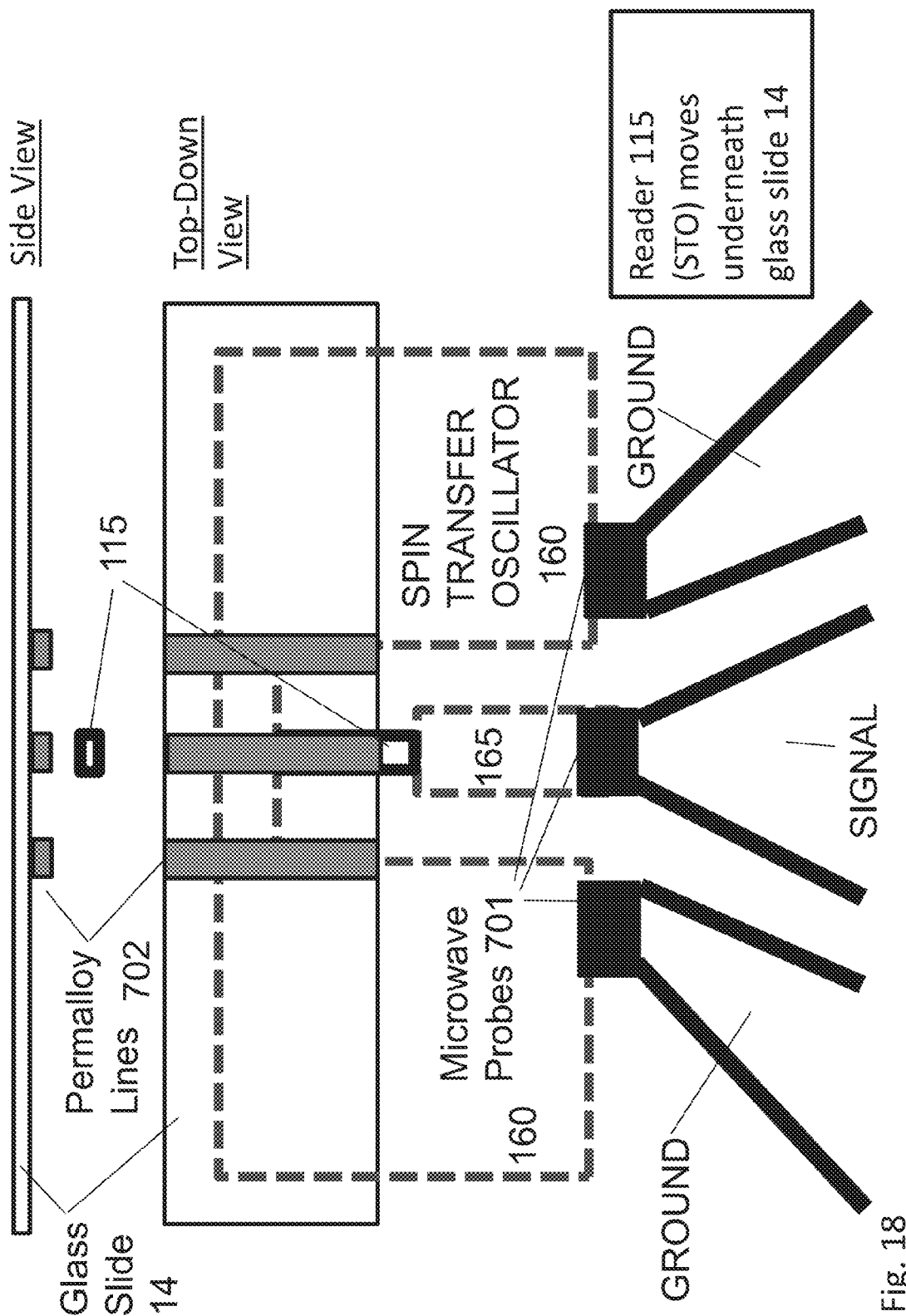
FIG. 18 is a schematic illustration of an STO, microwave probes and permalloy lines.

FIG. 18 is a schematic illustration of an STO, microwave probes 701 and permalloy lines 702 on glass slide.

Figure 19:
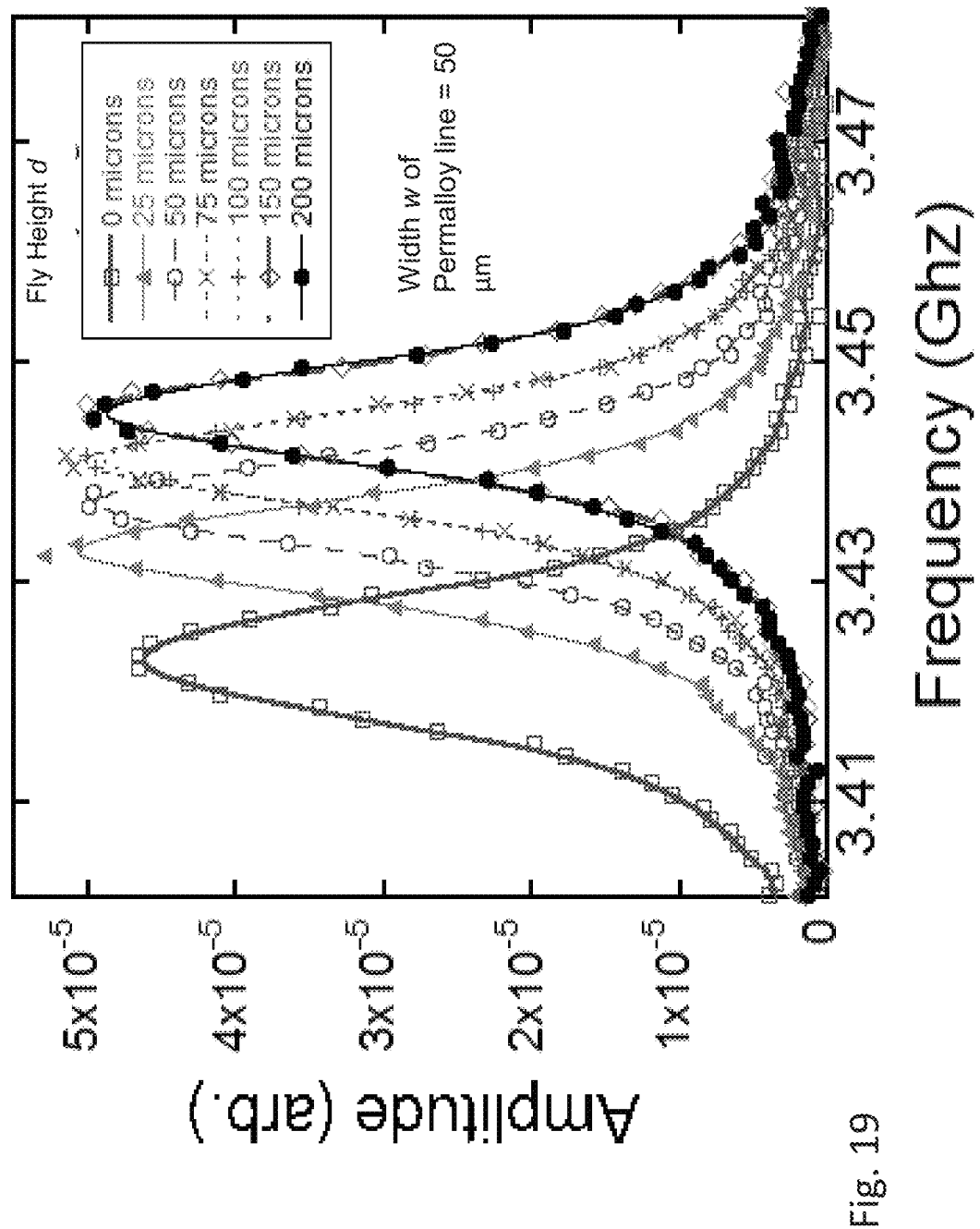
FIG. 19 is a graphical illustration showing STO response (microwave frequency) as a function of frequency for different fly heights of a 50 micron wide permalloy line.

FIG. 19 is a graphical illustration showing the data from the spectrum analyzer 110 displaying a shift in microwave precession frequency as a 50 μm permalloy line centered above the STO is separated at various fly heights above the STO in a 540 Oe external probe field. The greatest shift in precession frequency occurs at the closest fly height separation between the permalloy and STO.

Alternatives to highly permeable permalloys and low permeability air for use in conjunction with the present invention include soft amorphous ferromagnetic material with magnetic species (e.g. Fe) and network glass formers (e.g. Si, B) that hinder crystalline nucleation (e.g. Metglas 2605-SA2, with composition $Fe_{0.78}Si_{0.13}B_{0.09}$). Optical or electron beam lithography may be utilized as well as, potentially, dip pen deposition. For thermal writing on Metglas, one could sputter amorphous phase which is magnetically soft and has high permeability greater than 10,000. The crystalline phase has low magnetic permeability ~10. An alternative is to go from amorphous to crystalline phase in Metglas by heating above the glass temperature, 400-500° C. Another alternative is to go from crystalline to amorphous phase by first melting (1100° C.) followed by rapid quenching, 10° C./sec. In another alternative for non-rewritable storage, thin super paramagnetic layers of a magnetic species (e.g. Ni) could be interspersed with non-magnetic layers (e.g. Cu). Before heating, the layers would have high permeability. Selective heating of regions (i.e., bits) would induce interdiffusion between the layers, resulting in low permeability regions. Presently thermally writing is being done with a laser.

Figure 20:
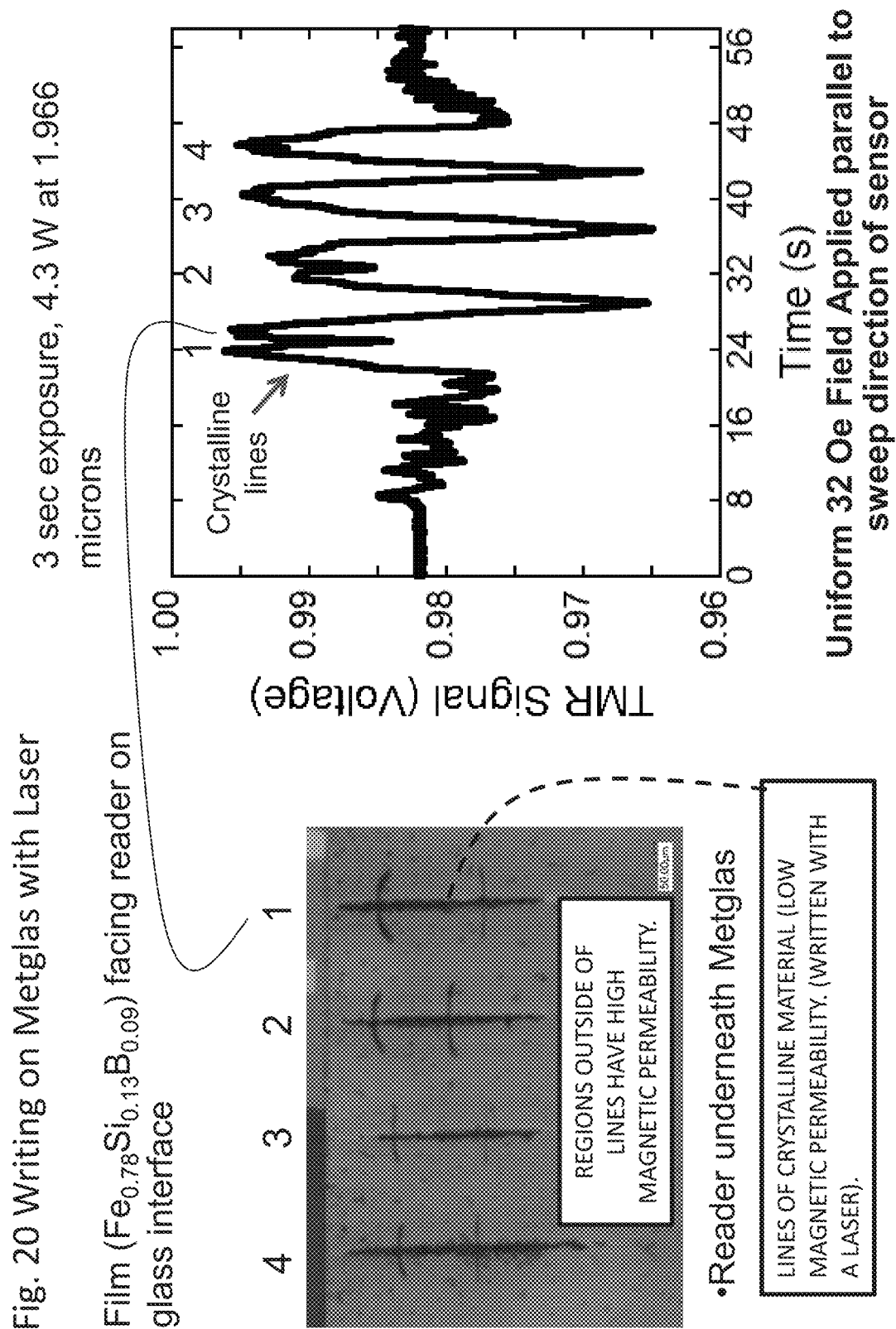
FIG. 20 Illustrates writing on Metglas with 4.3 W, 3 sec laser pulses with the regions outside of the laser writing have high magnetic permeability and the lines of crystalline material resulting from the laser heating have low permeability. Shown to the right of FIG. 20 are the results of the reading of the low permeability lines shown in the left portion of this figure written by laser heating.

FIG. 20 illustrates writing on Metglas 2605-SA2 with a 1.966 μm laser at 4.3 W for 3 sec exposure (roughly). The regions outside of the laser writing have high magnetic permeability. The lines of crystalline material resulting from the laser heating have low permeability.

Figure 21:
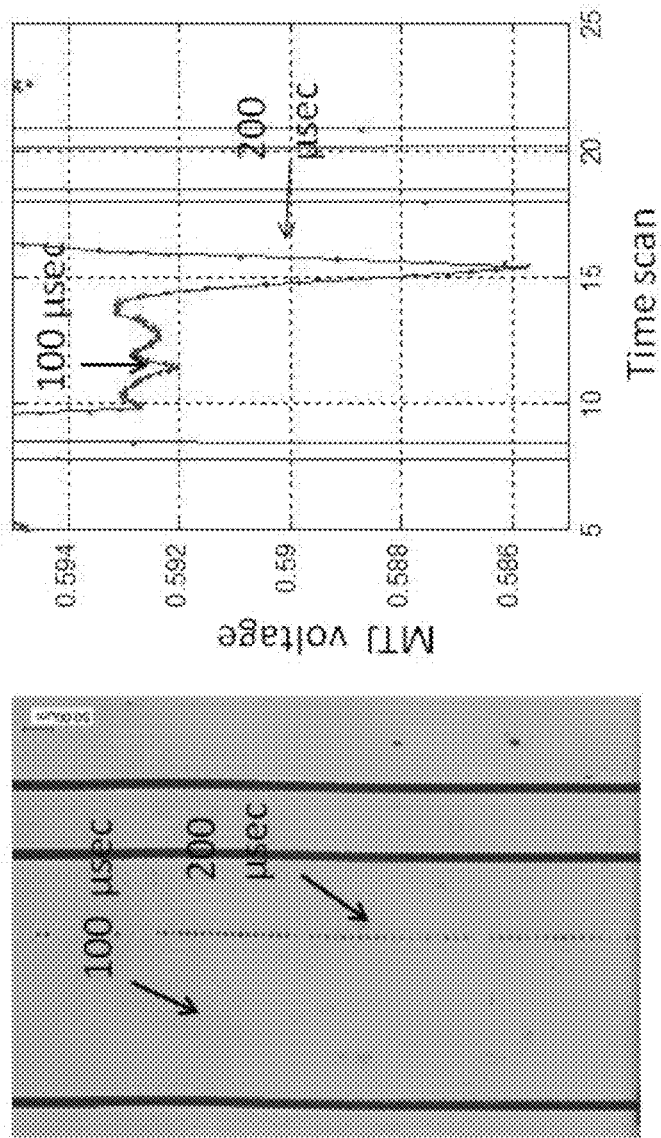
FIG. 21 is an illustration showing different areas of permeability with laser pulses of different duration.

FIG. 21 is an illustration showing different areas of permeability written with laser pulses of different length.

Figure 22:
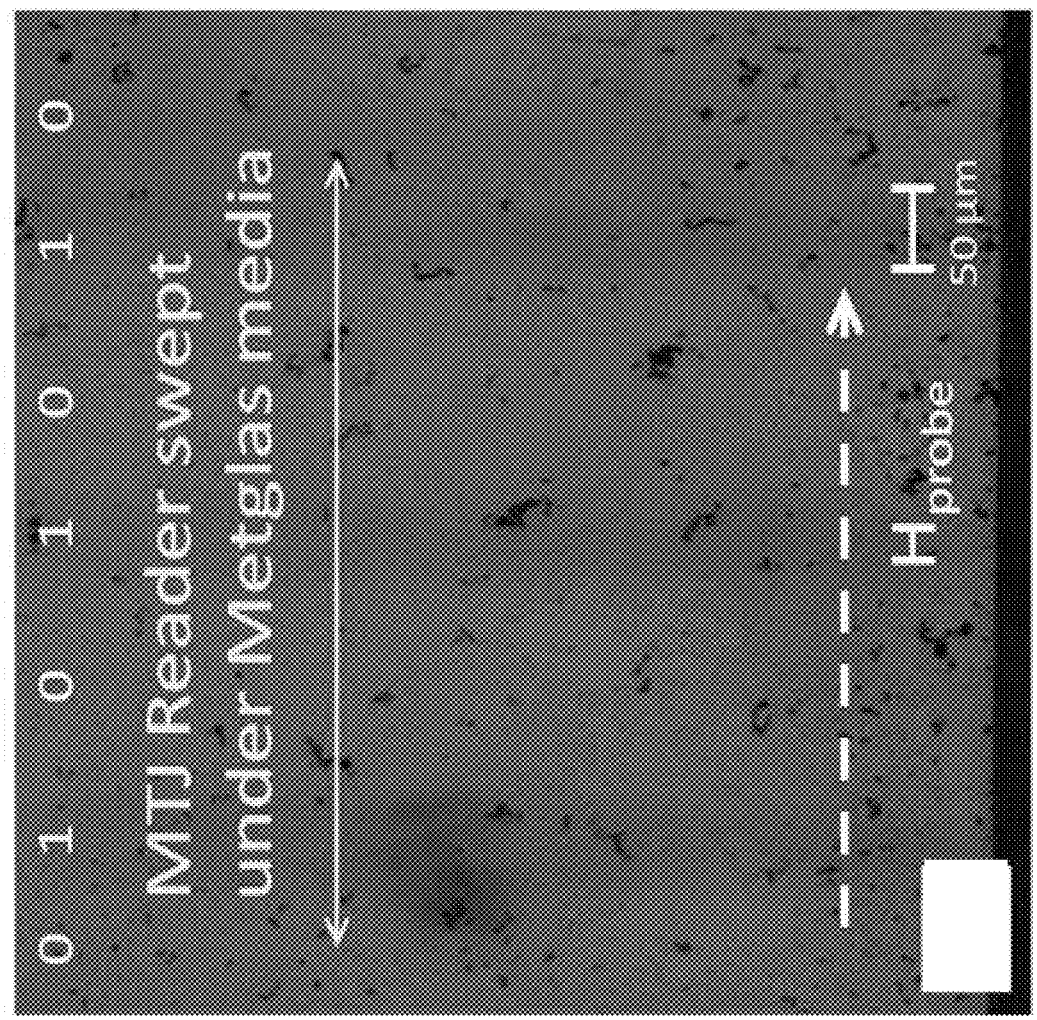
FIG. 22 is an illustration showing a microscope image of the three darker lines of crystalline that were written in high magnetic permeamorphous Metglas. The crystalline lines have much lower permeability than amorphous Metglas.

FIG. 22 is an illustration showing a microscope image of the three darker lines of crystalline that were written in high magnetic permeability amorphous Metglas with a laser. The crystalline lines have much lower permeability than amorphous Metglas.

Figure 23:
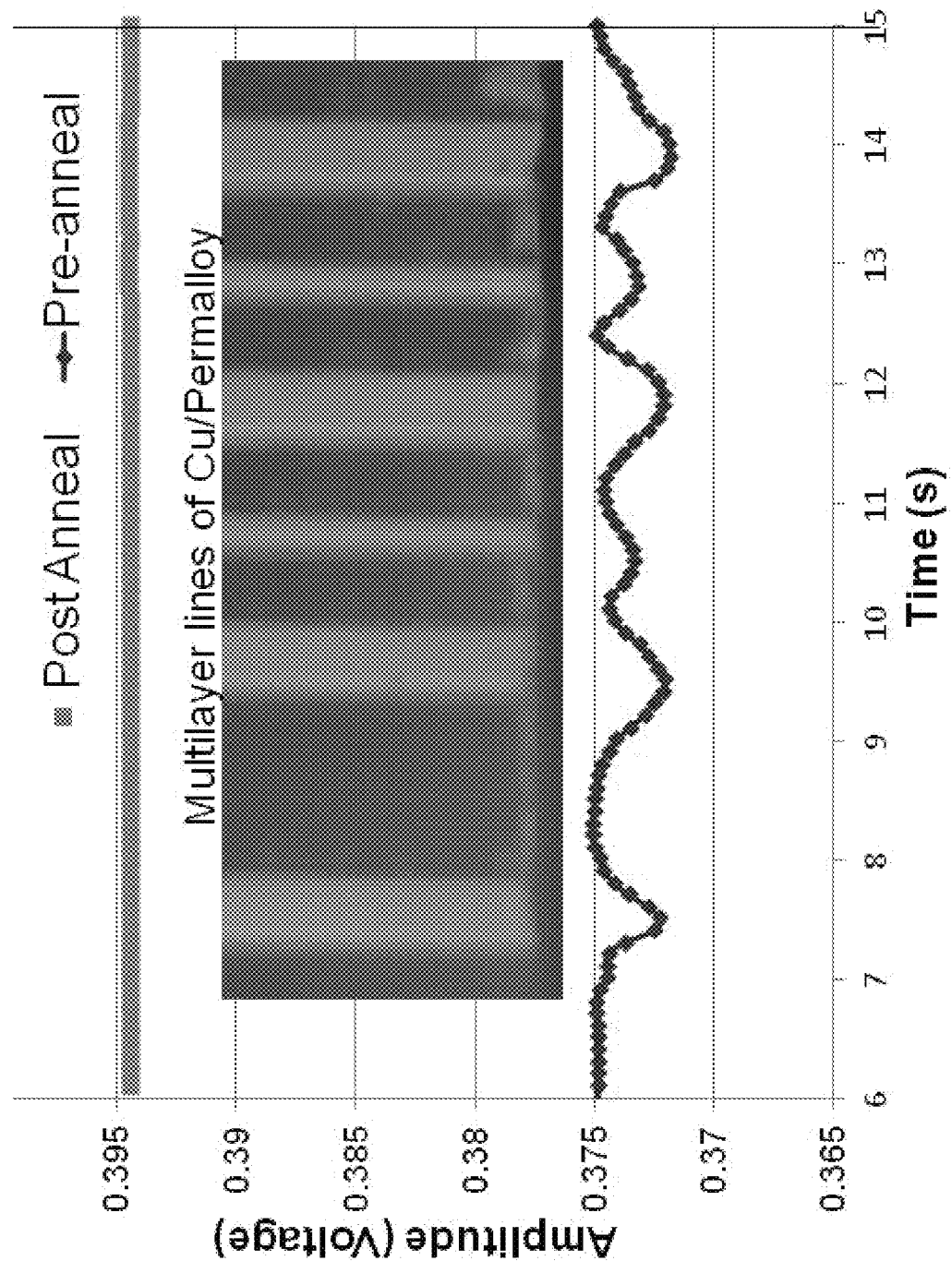
FIG. 23 is an illustration showing a microscope image of bilayer lines of permalloy and Cu and the reading of the permeability of these lines before and after heating.

FIG. 23 is an illustration showing a microscope image of bilayer lines of permalloy and Cu and the reading of the permeability of these lines before and after heating. When the bilayer is heated the copper diffuses into the permalloy and nearly reduces the permeability to zero. Thus, changes in the permeability can be effectuated by heating the lines of bilayers of copper and permalloy.

Figure 24:
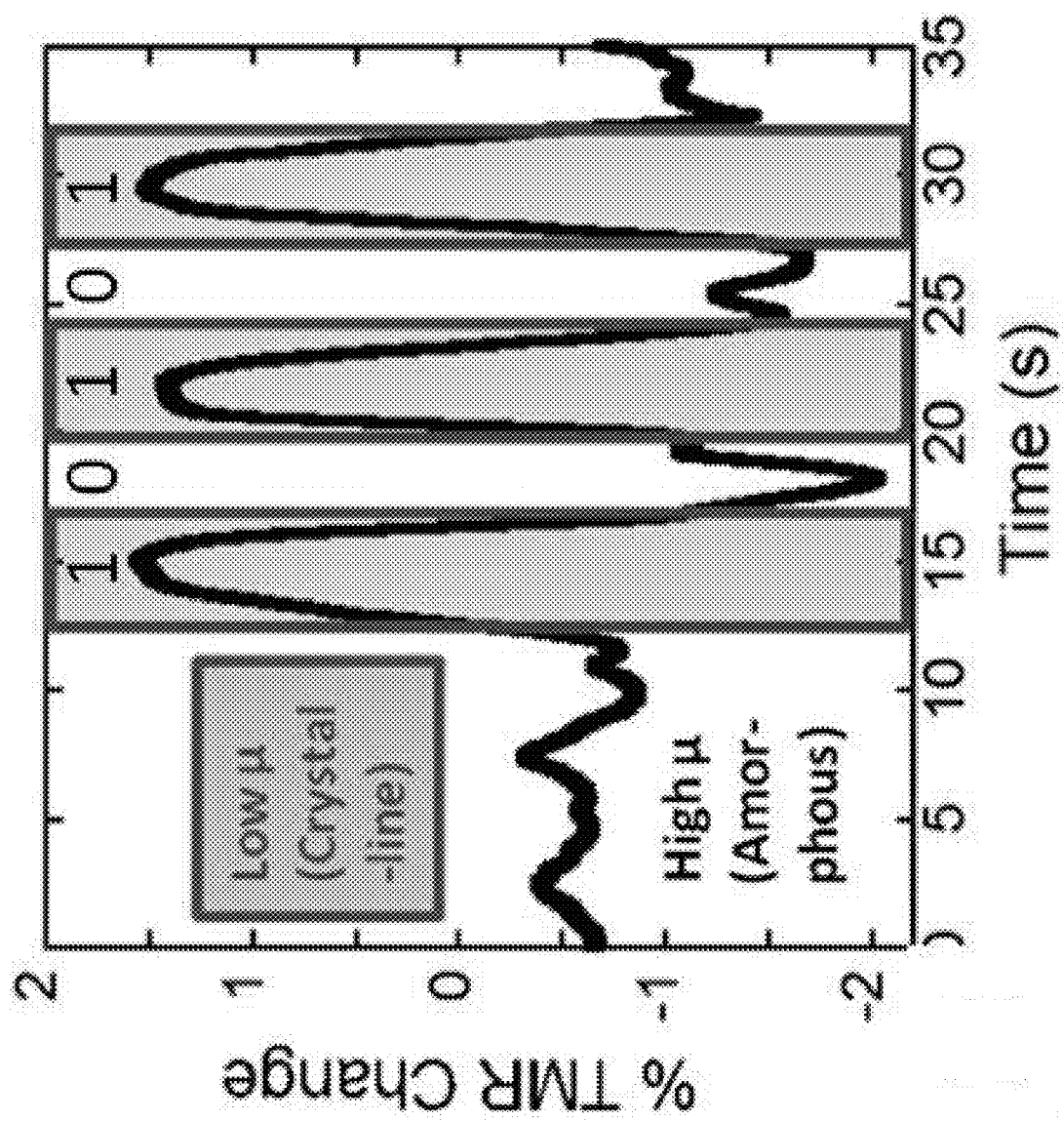
FIG. 24 is a graphical illustration showing the reading of the permeability change of the media in FIG. 22 with a magnetic tunnel junction reader.

FIG. 24 is a graphical illustration showing the reading of the permeability change of the media in FIG. 22 with a magnetic tunnel junction reader. FIG. 24 illustrates the changes in permeability can be read, using a magnetic tunnel junction, the changes being induced via writing with a laser as shown in FIG. 22 using a magnetic tunnel junction. Changes in the permeability can also be accomplished using ohmic heating or with evanescent heating, as shown in FIG. 26.

Figure 25:
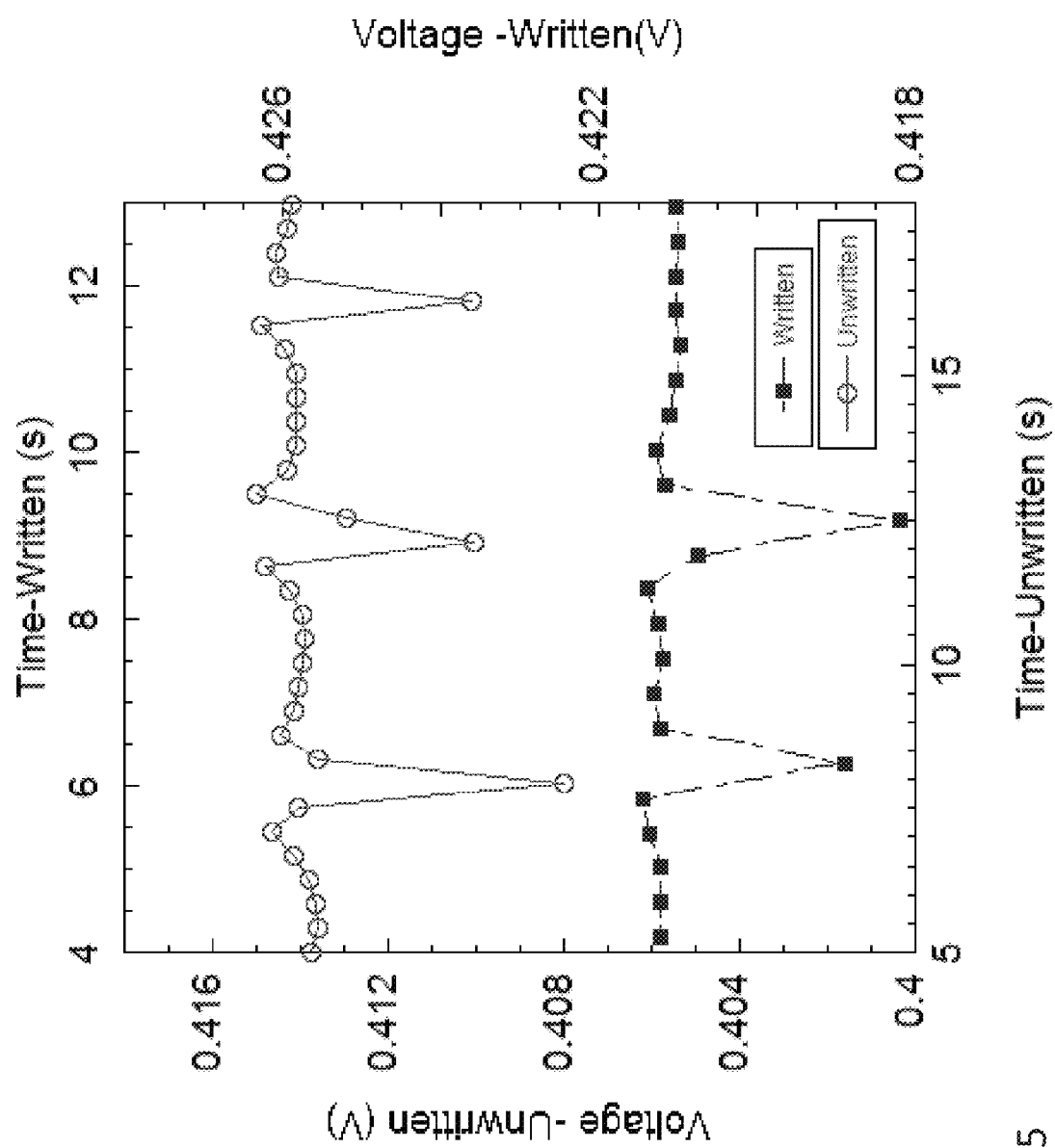
FIG. 25 is an illustration showing magnetic tunnel junction scans of lines of copper and permalloy lines before and after one of the lines was heated by ohmic heating.

FIG. 25 is an illustration showing magnetic tunnel junction scans of lines of copper and permalloy lines before and after one of the lines was heated by ohmic heating. Ohmic heating can be used to write information at high density.

Figure 26:
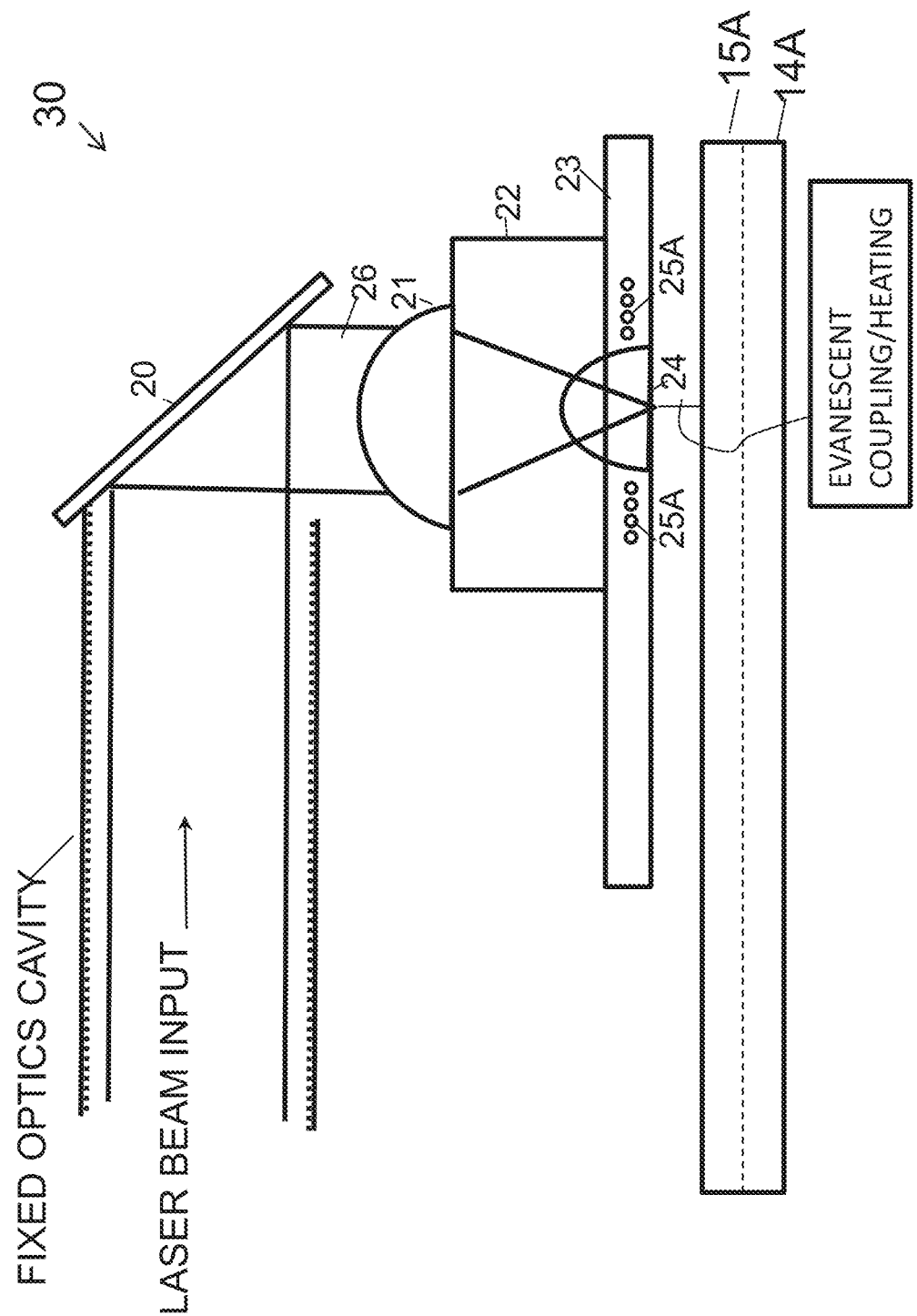
FIG. 26 is an illustration showing how an evanescent field is used in heat-assisted magnetic recording (HAMR) to achieve heating in a small region.

Information on media can be accomplished using heat assisted magnetic recording (HAMR) read heads, a depiction of which is shown in FIG. 26. Using such heads, regions as small as 28 by 38 nm may be heated to 700° C.

The preferred embodiment shown in FIG. 26 comprises a substrate 14A having magnetic material for storing information based upon regions of high and low permeability. A reader 115 (shown in FIG. 18) comprises a sensor for reading information by measuring the magnetic permeability. The bits are read by subjecting them to a magnetic field and measuring their effect on the magnetic field. The magnetic field can be an external field (i.e., an external probe field) and/or a magnetic field from the spin transfer oscillator 160 (shown in FIG. 18). The magnetic field at the position of the STO sensor determines the frequency, Q, and/or amplitude of the microwave radiation. Thus, measuring the microwave radiation emitted from the STO determines the magnetic permeability of the first and second portions (of differing permeability). Optionally, when the at least one first or second portion are subjected to the magnetic field, they modify the magnetic field at the position of the sensor which in turn determines the properties of the microwave radiation, namely the frequency, Q, and amplitude. The resultant radiation is compared to a reference frequency to determine whether the shift in frequency is sufficient to indicate whether the at least one first or second portion has low permeability or high permeability. The resultant radiation may be compared to a reference frequency using a mixer and comparator and the frequency of the STO microwave radiation is changed when the STO microwave radiation is effected by the magnetic field change caused by the permeability of at least one first or second portion. The at least one first portion of low permeability may be created by heating the magnetic material with a laser, hot tip, or ohmic heating such that the atomic structure is changed. Alternatively, the heating may be done with an evanescent field. In this case, a laser, wave guide, and a near field transducer may be required. The near field transducer operates to produce an evanescent wave is a near-field wave having an intensity that exponentially decays over the distance from the boundary from where wave originated. Evanescent waves form (in the location shown by the text box) when an electromagnet wave encounters an obstruction through which there is a small gap (or hole) from which a wave may propagate a short distance into a new medium or space. If a laser is placed near a plate with a small hole whose diameter is less than the wave length of the laser light, light will propagate a short distance through the hole.

Evanescent waves are created by (1) to coupling a laser output into the wave guide that carries the energy to the near field transducer (NFT), (2) coupling the energy to the near field transducer and having the near field transducer (NFT) create the evanescent wave. It is necessary to heat the media without overheating and causing wear on the near field transducer, which constrains the wave to about 25 nm. One method for avoiding damaging the near field transducer is to send less of the energy and/or send some of the energy via a separate path; such that there is two stage heating (first stage heating directly from a wave guide and second stage heating from a near field transducer. When using a waveguide, the core of the wave guide can have a core of $Ta_2O_5$. The first stage heats the media several hundreds of degrees centigrade. The second stage starts heating before the media has cooled from its peak temperature by 10% from the heating from the first stage.

FIG. 26 is an illustration showing how an evanescent field is used in heat assisted magnetic recording (HAMR) to achieve heating in a small region. A laser beam provides an evanescent wave that is reflected by a mirror 20 into objective lens 21 which focuses the laser light beam into a solid immersion lens 24. Unlike conventional magneto-optical devices, the laser is focused at the bottom of the solid immersion lens 24; not on the media. As is known in the art, the tube diameter of laser cavity that produces the evanescent wave is less than the wavelength of the light beam such that the portion that is emitted is less than wavelength.

The solid immersion lens 24 has higher magnification and numerical aperture than common lenses because the object space is filled with a high-refractive-index. The spot size is reduced by a factor of one over the refractive index of the solid lens. The index can be 2.5 for GaN. The energy in the focused spot can be coupled evanescently into the medium situated in the near field of the optical spot (near field transducer). The distance between the solid immersion lens 24 and the surface 15A of the medium 14A is less than half the diameter of the spot. One of ordinary skill in the art would appreciate that other lens and/or components could be utilized without departing from the scope of the invention. Solid immersion mirrors may also be used. Near field transducers use apertures or antennas as shown in FIG. 26 such as, for example, an aperture, triangle aperture, L-shaped aperture, bowtie aperture, etc. A magnetic coil 25 surrounds the solid immersion lens and provides a magnetic field which may be used as a probe field. Although one laser is sufficient, two lasers may be used so that one heats the area around the targeted shot so the evanescent wave laser doesn't have to raise the temperature as much as in the singular laser case.

A slider 23 may be used to control height or distance of the support from the media disk 14A. The height or distance is approximately a nanometer from the surface 15A of the media disk 14A as the evanescent wave dies quickly.

The use of heat assisted recording heads are used to thermally change the permeability of Metglass™ or multi-layers of copper and permalloy. In the case of copper, which diffuses into the nickel region and destroys the magnetism of the nickel, it is envisioned that the device of FIG. 26 will achieve more than 600° C. in a 30 nm region. This provides the ability to store, at low cost, large amounts of information (classified or not classified) indefinitely without being concerned about the humidity, temperature and EM pulses. The information could include photos and cloud storage.

The advantages of the system that includes near field writing as depicted in FIG. 26 are high density, low cost, non-erasable, radiation hard and not effected by EM pulses, indefinitely long retention time, rapid access to the information, and storage without needing to be concerned about temperature or humidity.

Note that an array of hard disks (sometimes referred to as RAID (originally redundant array of inexpensive disks) allowing the embodiment of FIG. 26 to configure many desktop class hard drives for use in RAID setups. The hard disks may be changed by robots.

The system of FIG. 26 may be combined with a reader incorporating a spin torque oscillator that radiates an RF signal which is effected by the different permeability regions, wherein the effected signal is inputted into a mixer (such as that shown in FIG. 6) which measures the frequency shift by comparing the frequency of the effected signal with a known reference frequency to determine a difference value which indicates whether the spin torque oscillator is in close proximity to either a first portion of low permeability or a second portion of high permeability, and wherein either a "1" or "0" bit is outputted according to the mixer output. Optionally, the mixer output may be further inputted into a comparator which compares the difference value to a predetermined frequency shift.

Figure 27:
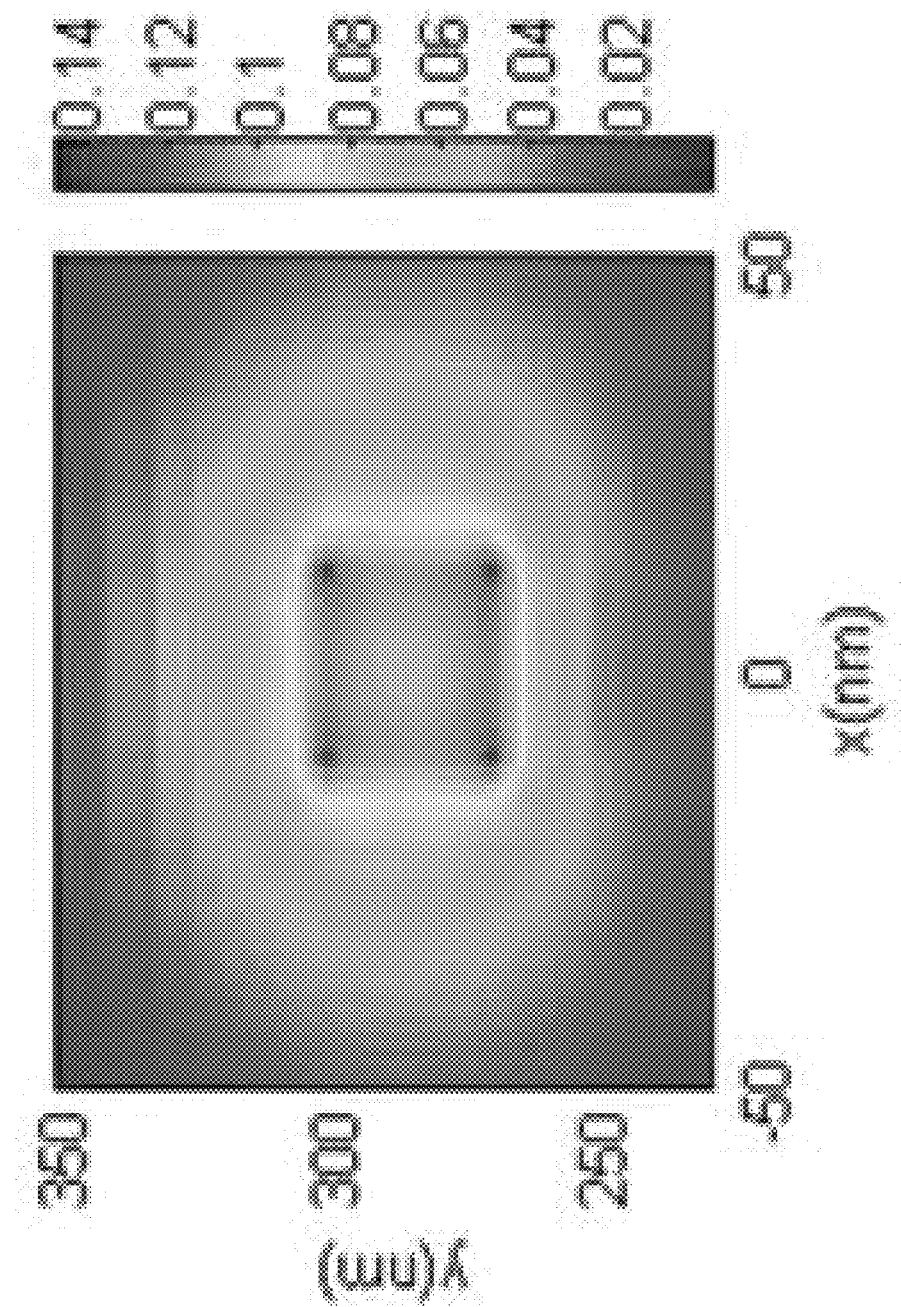
FIG. 27 is an illustration showing a nanospot size of 28 nm by 38 nm written by efficient plasmonic transducer using heat-assisted magnetic recording (HAMR).

FIG. 27 is an illustration showing a nanospot size of 28 nm by 38 nm written by efficient plasmonic Heat Assisted Magnetic Recording (HAMR) transducer, such as the embodiment shown in FIG. 26. Modeling suggests that regions can be heated to over 700° C. This temperature is high enough to crystallize Metglas™ or to create sufficient diffusion of copper into permalloy to make it essentially non-magnetic. In K. Eason, et al., IEEE Trans. On Magnetics 50, 3201 307 (2014) it was suggested that temperatures of 1000° C. may be achieved. The information can be used with a magnetic tunnel junctions read head and a probe field.

Figure 28:
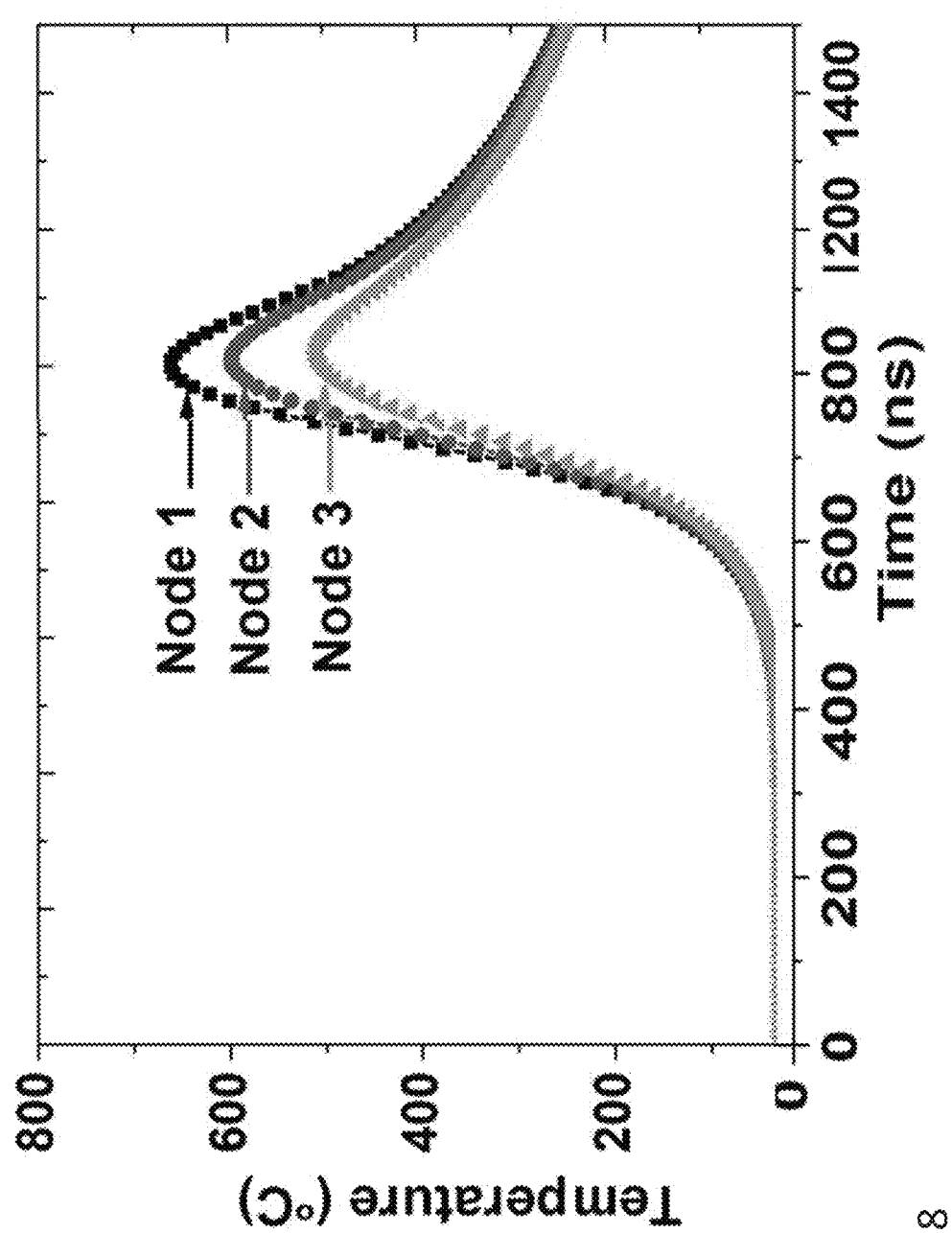
FIG. 28 is a graphical illustration showing the temperature achieved by HAMR for different laser modes.

FIG. 28 is a graphical illustration showing the temperature achieved by heat assisted magnetic recording (HAMR) for different laser modes. For the writing that changes the permeability of media, no magnetic field is needed.

FIG. 29 diagrammatically illustrates precessing of the magnetization $\vec{M}$ in an effective magnetic field at the Larmor frequency. The Larmor frequency is altered by changing the effective field using soft magnetic material near the STO; and the effective field can be large, e.g., greater than 100 Oe. Thus, one can read high permeability bits using spin torque oscillators (STO). Having a reader that operates in large fields may be an advantage since one may have to use large fields for small bits with reduced permeability per unit volume.

FIG. 30 diagrammatically illustrates the reading of bits using spin torque oscillators (STO) based on using the spin polarized currents as postulated by Slonczewski in 1996.

It is noted that magnetization M tends to press around magnetic field H and to relax into the direction of the field. The spin polarized current can maintain an angle between M & H and the system radiates at a microwave frequencies dependent on H; and the changing H via soft magnetic material changes the frequency of the STO. The sense element size is 20 nm. Thus, one can probably read 20 nm bits if the fly height is of order 20 nm or still smaller.

Using the preferred embodiments, reading 10 micron wide permalloy lines with a 45 dB signal to noise ratio have been attained using magnetic tunnel junctions. Spin transfer oscillators can also be used for reading. Potential applications include tagging, a magnetic card reader, magnetic tunnel junctions used for reading, laser thermal writing of magnetic material, securely storing large amount of data indefinitely, ability to go to sub microns features, 20 nm STO, and high density magnetic recording.

Figure 31:
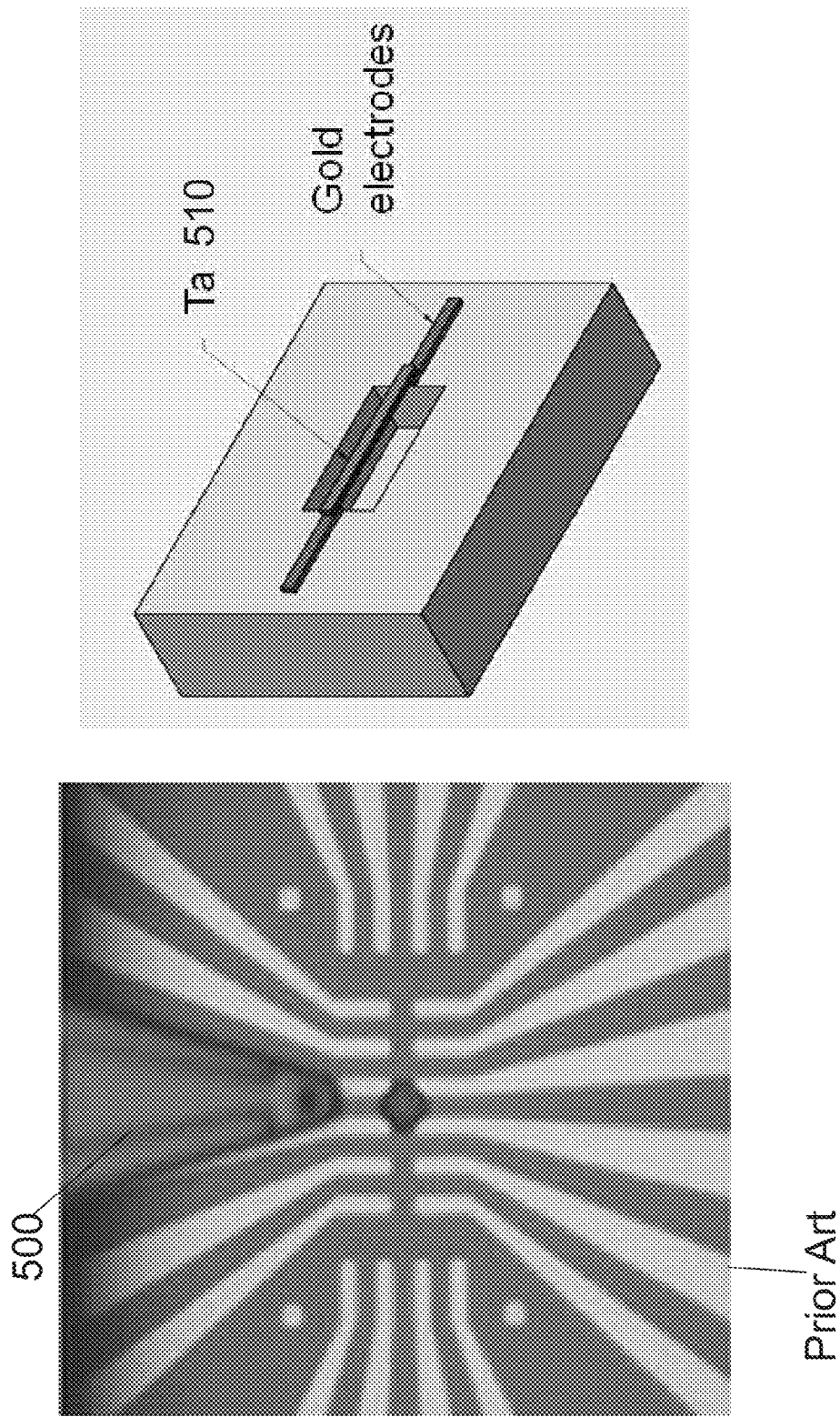
FIG. 31 illustrates alternative writing approaches utilizing the principles of the present invention.

Alternate approaches within the scope of the present invention include initially using a hot plate to heat Metglas above glass temperature 400 degrees ° C. so that it will crystallize and enable operator to "write" a line at a lower localized thermal energy than otherwise. FIG. 31 illustrates alternative writing approaches utilizing the principles of the present invention. The present invention contemplates dip pen writing, which is at present limited to micron size features. One can use parallel tips 500. Issues remain with wetting. Another form of thermal writing would involve a hot 'filament' (e.g. Tantalum wire) 510 that can transfer energy to the magnetic media (e.g. magnetic swipe card) to form lines of high and low permeability.

Alternate approaches towards writing include e-beam writing, sputtering soft magnetic film, laser control of amorphous and crystalline phases, ink jet-like printing of the high magnetic permeability bits, creating nanoparticle slurry, dip pen writing, and thermal writing with sub-micron pens.

Figure 32:
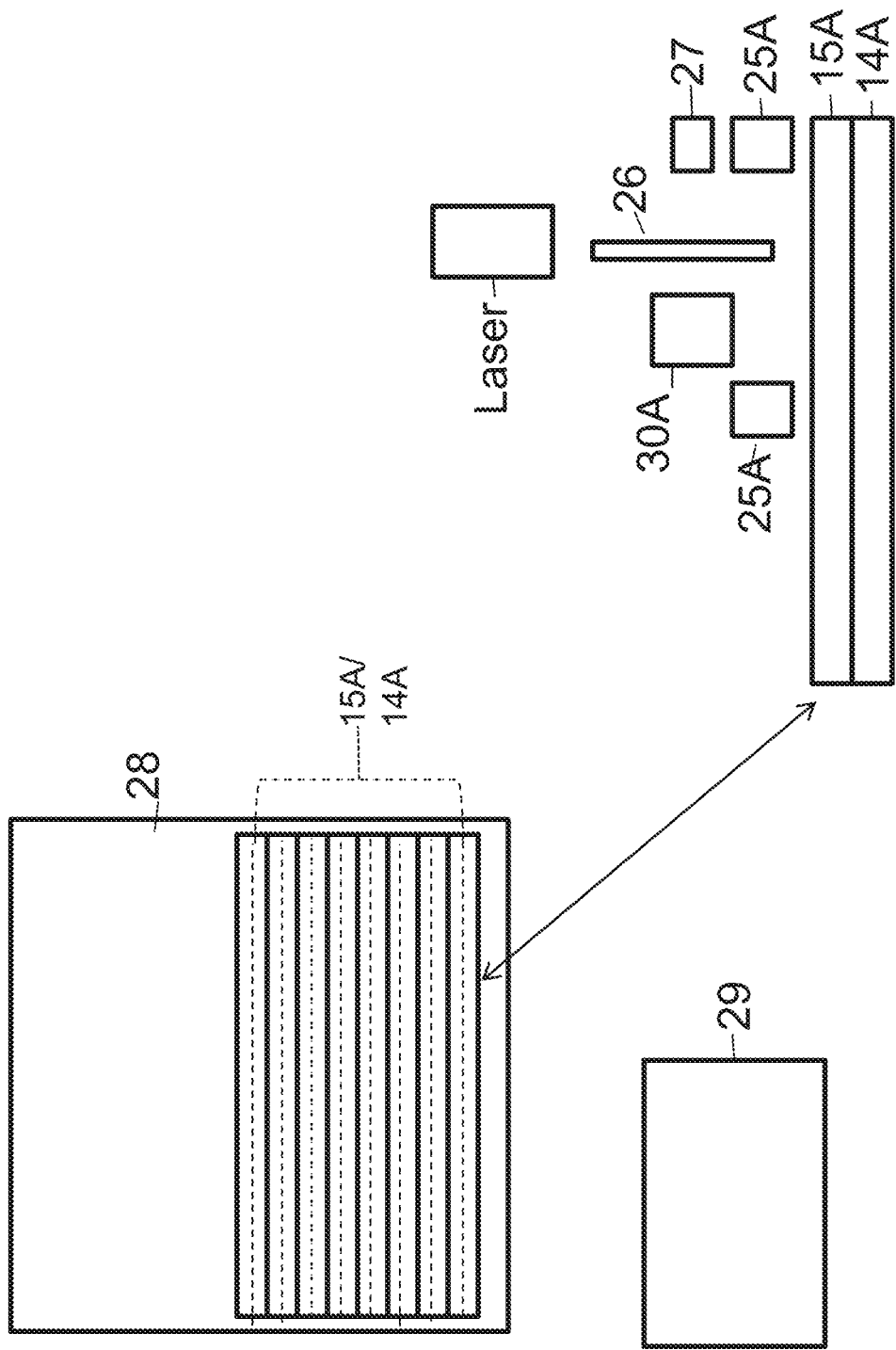
FIG. 32 is an illustration of a preferred embodiment of the present invention comprising a HAMR.

FIG. 32 is an illustration of a preferred embodiment of the present invention comprising a heat assisted magnetic recording type subassembly (HAMR). One of the methods for writing the information is to use a laser to heat materials to change their permeability. The density of writing directly is limited by the wave length. Another method is to use an evanescent wave to do the heating. The advantage of using an evanescent wave is that one can achieve higher density because the resolution is not limited by the wave length of the light.

The system shown in FIG. 32 for writing information uses an evanescent wave. The preferred embodiment of FIG. 32 comprises a disk substrate 14A, which may be, for example, formed of silicon (or glass), having media 15A formed thereon (which may be sputtered), as described in connection with the previously mentioned embodiments and such as shown in FIG. 2. The media may be, for example, a single layer deposited on the disk 14A by sputtering. The media 15A may be formed of materials such as, for example, Metglas™ an amorphous ferromagnet that has a large magnetic permeability, whose permeability can be increased or decreased thermally by heating by means that include a heater and/or an evanescent wave. When heated to over 400° C., the glass temperature, Metglas™ crystallizes into nanocrystals or microcrystals that have a much smaller permeability.

As an alternative, the media 15A may comprise bilayers comprising a ferromagnet and a nonferromagnetic material that decreases the permeability of the ferromagnet when the bilayer is heated causing the atoms of the nonmagnetic material diffuses into the ferromagnet. An example of bilayer suitable for use with the preferred embodiment is permalloy and copper. Permalloy is 80% nickel and 20% iron. Nickel becomes nonmagnetic if it has too many copper atoms intermixed. The advantage of using thinner layers and repeating them is that lower temperatures and shorter times can be used to cause sufficient diffusion to change the permeability. When the layers are sputtered, impurities can be added to the layers. The impurities will move to the grain boundaries. Doing this has the benefit of decreasing the in plane thermal conductivity. One type of impurity that can be used is carbon atoms. Decreasing the in plane thermal conductivity will decrease the probability that neighboring bits will be written when one writes a bit. Another advantage of adding impurities that reside at the grain boundaries is that they will tend inhibit the changes made thermally from propagating to neighboring b its. The top surface of the media is covered by a lubrication layer. A heater 30A is positioned above the media, which may be an HAMR as described in with FIG. 26. The heater can be used via its effect on thermal expansion to control the fly height. A laser illuminates the light cable 26. Elements 25A provide the source of the magnetic probe field, which is sensed by the magnetic sensor 27 (shown in FIG. 32). Also shown in FIG. 32 is a cassette 28 for disks and mechanism for inserting disks 15A/14A and electronics 29 for operating different components of the system.

As to the media 15A, it may comprise a single layer, a bilayer, or multilayers. The single layer media consists of a material whose permeability can be increased or decreased thermally by being heating by means that include a heater and/or an evanescent wave. An example of a material that can be used in a single layer is Metglas, an amorphous ferromagnet that has a large magnetic permeability. When heated to over 400° C., the glass temperature, Metglas™ crystallizes into nanocrystals or microcrystals that have a much smaller permeability. A higher temperature of over 1000° C. and rapid quenching is required to return the Metglas back to its amorphous state. A temperature of 550 is required to have a high diffusion rate of Cu atoms into Permalloy. The heater 30A is used to heat the media so that the evanescent wave does not have to supply as much energy to heat up the bit. Alternatively, light from the laser or from another laser, can be used to heat the region around the bit so that the evanescent wave does not have to supply as much energy to heat up the bit. The laser inputs into the optical fiber 26, which carries the light to within one or a few nanometers of the surface. The evanescent wave emerges from the end of the optical fiber a distance that is some fraction of the diameter of the optical fiber. The source 25A of the probe field may, for example, be an electromagnet or permanent magnetic whose field is directed parallel to the surface of the wafer and whose magnitude is set at the field that maximizes the sensitivity of the magnetic sensor. The magnetic sensor is either a magnetic tunnel junction (MTJ) or spin transfer oscillator. The magnetic sensor 27 determines the degree to which the probe field is altered in the vicinity of the permeable bit. The cassette 28 holds two to more than a hundred disks and includes a mechanism for inserting disks on a rotating platform nm below the optical fiber and magnetic sensor. If the system includes the cassette and a mechanical system for changing the disks, then the entire system including the cassette, laser, optical fiber, and magnetic sensor must be fabricated and sealed in a clean room to avoid contamination from particles. The electronics 29 (with optional processor) for operating the different components of the system includes electronics for controlling the laser, the system for rotating the disk, the system for taking selected disks from the cassette and positioning them correctly, for operating the magnetic probe field and magnetic sensor, and inputting and outputting information. Suitable inputs and outputs may be connected to the system shown in FIG. 32.

Advantages of the preferred embodiment systems include the features that the information is not erased by magnetic fields or radiation; not affected by superparamagnetic limit; a card write and read systems with these advantages: very large commercial potential for a system that can securely store large amounts of data for decades, low cost writing of bits, low density applications, difficult to tamper with or modify the data, e.g., ID cards, using laser thermal writing of Metglas, high density applications using dip pen or thermal writing of Metglas with heated element or HAMR system.

Figure 33:
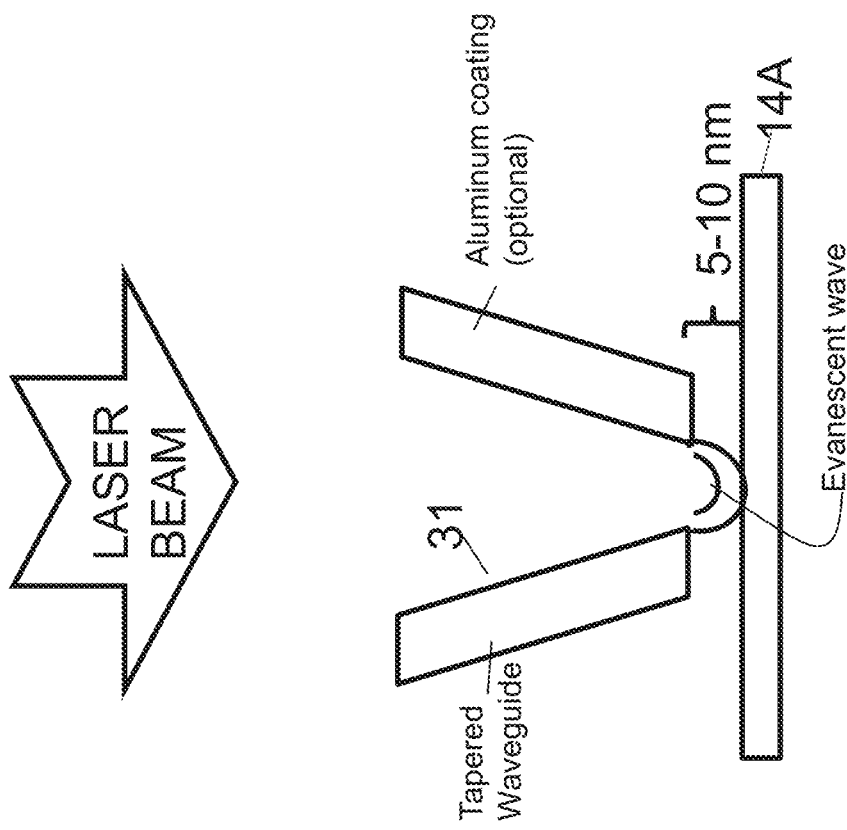
FIG. 33 is an illustration of a tapered wave guide used in conjunction with a heat assisted magnetic recording (HAMR) subassembly.

Shown in FIG. 33 is a tapered waveguide alternately utilized in conjunction with a heat assisted magnetic recording subassembly comprising a tapered waveguide 31. The tapered waveguide 33 may optionally be lined with a aluminum coating to facilitate heat transfer to the media 14A.

Examples of ferromagnetic material that can be used are permalloy and nickel. The ferromagnetic bit may consist of either a single bilayer of a ferromagnet such as permalloy and copper or the bilayer shown may be repeated to make a multilayer. Permalloy is typically approximately an 80% Ni, 20% Fe alloy. Using a multilayer will increase the amount of material and, hence the magnetization and the signal. Alternatively, one can use Ni or Metglas instead of permalloy. By adjusting the magnitude of the current and its duration, one can raise the temperature of a soft magnetic material such as Metglas above its glass temperature or cause the copper to diffuse into the ferromagnetic materials in the bilayer or multilayers. The time dependence of the pulse is also important. If the pulse turns off more quickly, more current is needed to reach the same temperature and to cause the same amount of diffusion. If the ferromagnetic is an amorphous material such as Metglas and if the pulse is turned off in millisecond, the soft magnetic material cools and will crystallize, thereby having a lower permeability. The advantage of this approach is that one can setup a fabrication process to produce large numbers of identical, blank memory chips, in order to minimize cost. The chips can then be written in a different lower cost system without the need of expensive lithography. Once written, the chips can be read by using a probe magnetic field and a magnetic tunnel junction reader or a spin transfer torque reader in a read head to measure how the bits modify the magnetic flux lines of a probe magnetic field. The reader may or may not be part of the media. When using a moving read head, the read head either moves over the media or the media is moved under the read head. Readers with the needed smaller dimensions have already been fabricated by many companies. Alternatively, one can have a magnetic sensor located near each sensor.

There are alternative methods for writing the media or creating the tunable permeable layer. Specifically the media or tunable permeable layer can be a bilayer or multilayer of copper and nickel or a bilayer or bilayers or multilayers of copper and permalloy. In this case, heating the bilayer or multilayer will cause the copper and nickel or permalloy to alloy and the resulting alloy will be non-magnetic or less magnetic. This approach will be used in creating a read only memory.

The percentage change in tunneling magneto resistance (TMR) will be measured by sweeping the reader over the media. As an example for reading micron sized media, the reader may have a fly height d of 5 microns and the probe field $H_{probe}$=32 Oe. Smaller fly heights will be required for high density media.

Using a different optional design that allows for heating to higher temperatures and faster cooling, the tunable portion of an amorphous ferromagnetic material can revert to its original permeability. The tunable permeability portion may comprises soft magnetic material, e.g., Metglas, that has a high magnetic permeability when it is amorphous and a low magnetic permeability when it is crystalline. The electrodes will allow the current to pass through the heating (laser) element associated with a particular bit. By passing a current through the laser, and by adjusting the magnitude of the current, one can raise the temperature of the soft magnetic material above its glass temperature. By using a higher current, one can melt the amorphous material. The time dependence of the pulse is also important. If the pulse turns off in millisecond, the soft magnetic material cools and will crystallize and have a lower permeability. If the heat melts the Metglas and the pulse turns off in microseconds and the cooling rate is high, the soft magnetic material will revert to being amorphous and have a large permeability. In other words, if the cooling is slow, the magnetic portion of the memory cell will be in a crystalline state with a low magnetic permeability irrespective of whether a current is applied thereafter, similar in effect to a write once, read only memory comprising 20 nm non-erasable bits, As discussed above, a current through the laser can be used to modify the permeability of the tunable permeability ferromagnetic layer. Tunable ferromagnetic layer is a ferromagnetic material whose permeability may be changed by heating. As a result of the changeable natures of the ferromagnetic layer, the cell may have one of 2 states at a given time.

Optionally, heat sinks may be utilized so that neighboring bits are not affected by the writing. The heat sinks can be, for example, pillars of Cu. If this is done the array consists of unit that will have an area of 16F2 and there are two bits in each unit. Thus, the area per bit is 8F2.

When using Cu/Ni bilayers or multilayers, the ferromagnetic layer or magnetic bit will become nonmagnetic if heated because diffusion will cause the Ni atoms to have too many Cu neighbors. Ni atoms become nonmagnetic in Ni/Cu alloys when they have too many Cu atoms. The change is irreversible. When Metglas is amorphous, it has a high permeability and a small coercivity. If Metglas is crystalline it has a low permeability and a higher coercivity. If one chooses Metglas, the t ferromagnetic layer or magnetic bit1, 1A will crystallize if heated to 500° C. It will be possible, but difficult, to return the Metglas to the amorphous state. Thus, these choices for the tunable ferromagnetic layer will lead to a non-erasable memory. If one uses $Ni_{75}Fe_{25}$, one has a rewritable memory. Material for ferromagnetic layer or magnetic bit1, 1A that are rewritable include Finemet (an alloy of Fe, Zr, Nb, Hf B, and Cu), other versions of permalloy such as Nanoperm and Hitperm. If the ferromagnetic layer or magnetic bit1, 1A cools quickly, it becomes a disordered alloy and the permeability is much larger than if one slowly cools and the material crystallizes into the compound $Ni_3Fe$. Heating the tunable ferromagnetic layer without affecting the MTJ, can be facilitated by providing an air space of 2 to 100 nm between the MTJ and the extra layers. Though extra power is required in what has been described above, heating is already utilized in heat assisted magnetic recording HAMR to allow the use of materials with higher anisotropy in order to increase the thermal stability.

The term radiation hard used here means not affected adversely by exposure to ionizing radiation (total dose) effects from a cobalt-60 (60Co) gamma ray source or affected by lightening or intense current pulses. The gamma radiation test is described in MIL-STD-883J.

Figure 35A:
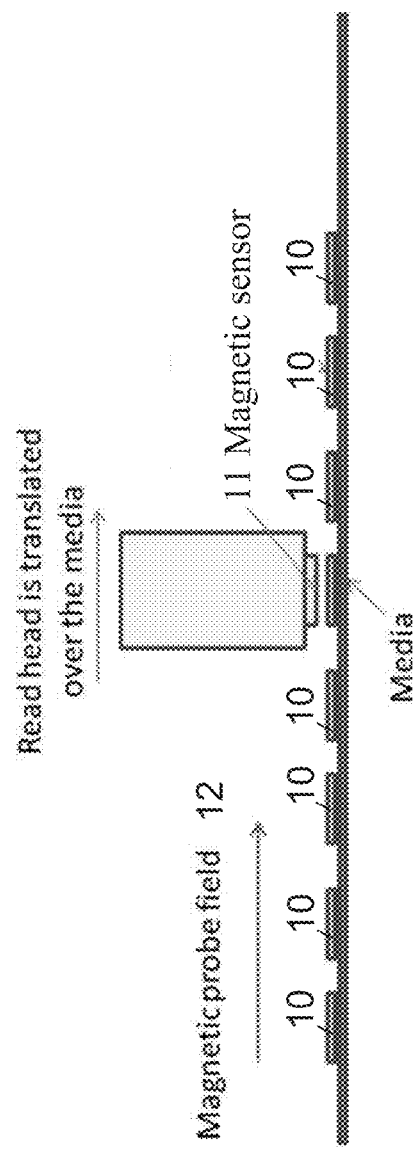
FIG. 35A is a schematic illustration depicting the reading of a bit using a magnetic sensor 11.

The media can be read by using a probe field and a method for detecting the changes in the probe field by placing a magnetic sensor directly over the media. The reader is shown in FIG. 35A. The magnetic sensor 11 shown in FIG. 35A can be a magnetic tunnel junction (MTJ) or a spin transfer oscillator. MTJ sensors are devices whose resistivity depends on the magnetic field. One measures the voltage as a constant current passes through the device. The voltage changes as the magnetic field changes. As in standard read heads, the read head is translated over the media at a small (nm) fly height.

Figure 35B:
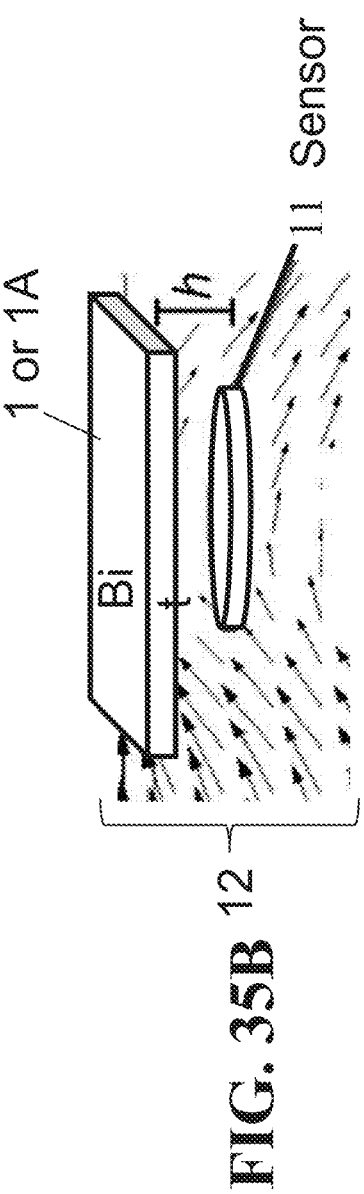
FIG. 35B is a schematic Illustration depicting how the magnetic flux lines of the probe field are altered by a high permeability bit. The magnetic sensor detects the decrease in flux.

FIG. 35B diagrammatically depicts how the flux lines of the probe field 12 are drawn into a high permeability material and that, because of this, the sensor sees a smaller field. Note that the position of the bit 1 relative to the sensor 11 is reversed from the positions shown in FIG. 35A. As the ferromagnetic layer or magnetic bit or bilayer bit passes through a magnetic field 12, if the bit is in a high permeability state, the magnetic flux will be drawn towards the ferromagnetic layer or magnetic bit, thus reducing the field sensed by the magnetic sensor 11.

Figure 36A:
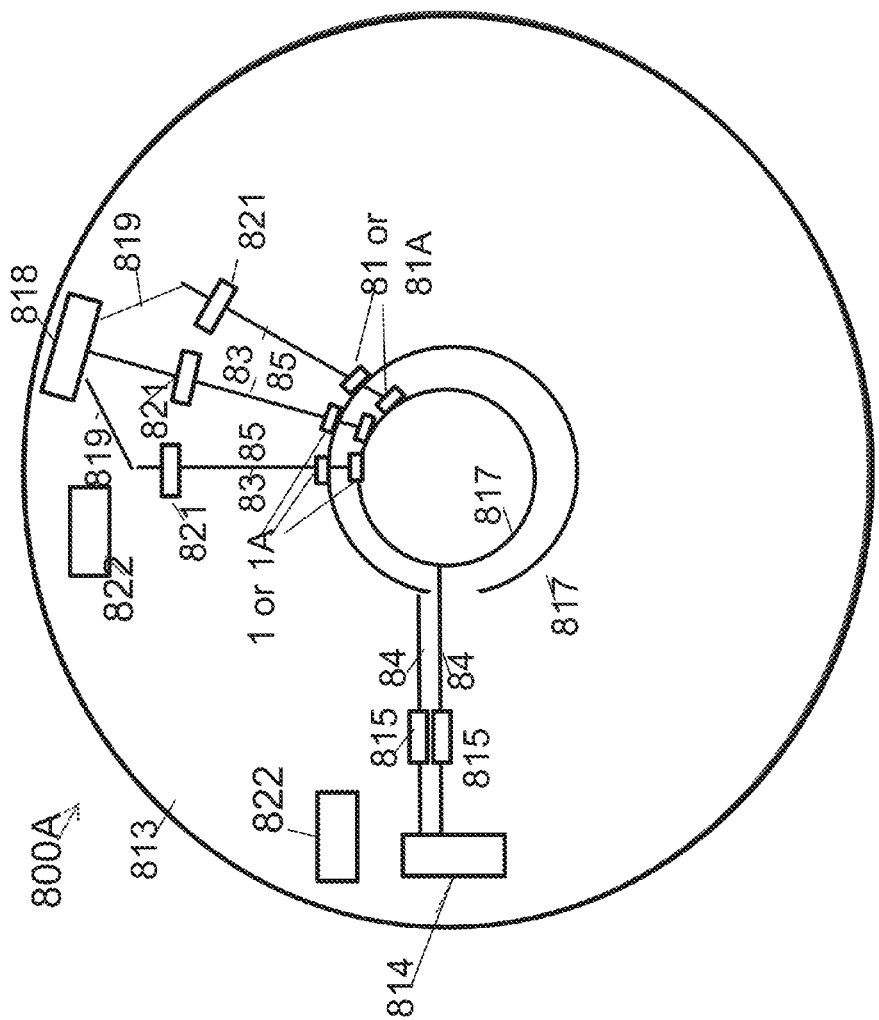
FIG. 36A is a schematic illustration of an alternate preferred embodiment showing implementation in a disc configuration in which the electronics for doing the writing is on the disc.
Figure 36B:
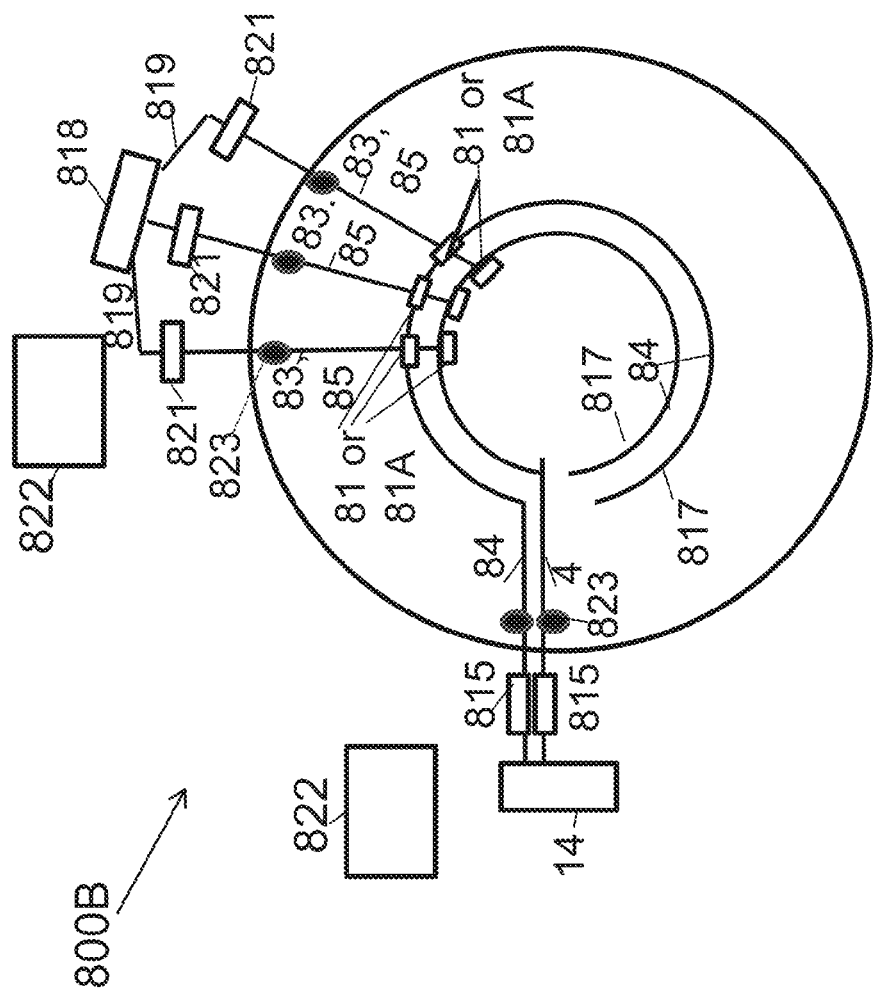
FIG. 36B is a schematic illustration of an alternate preferred embodiment showing implementation in a disc configuration in which the electronics for controlling the writing is separate from the disc.

FIGS. 36A and 36B are schematic illustrations of alternate preferred embodiments 800A and 800B showing implementation in a disc configuration, such as, for example, on a silicon circular disk 813. The electronics for doing the writing can be on the disc as in FIG. 36A or the electronics can be a separate unit that is connected via electrodes 823 and contacts as shown in FIG. 36B. Individual bits are written by sending voltage pulses to the AND gates. Only a small portion of the disk showing 6 bits is shown in FIGS. 36A and 36B. Lithography may be used to fabricate the electrodes, electronic switches 815 and 821, radiation hard bits on the circular disk as shown in FIGS. 36A & B. The current sources are the CMOS. For micron-sized memory, masks, optical lithography, and a variety of photoresist techniques may be utilized. To achieve nanometer-size memory, e-beam lithography or laser heating and near field transducers may be used. The materials may be deposited by sputtering. The electrodes and switches are used to apply current pulses from CMOS current sources that are part of the laser writing system described in FIG. 26 to heat specific bits 81 or 81A (bilayered or multilayered). Switch circuitry 815 and 821 is connected by lines 83, 84 to the AND gates 88, positioned at each cell location. Circular contacts 817 are configured to connect lines 84. Electrode 85 that is part of the path for the laser heater current is above electrode 83. Switch circuitry 814 and 818 is connected to the switches 815 and 821 (by connector 819) which operate to transfer a pulse to the AND gates 88 at a programmed time. Switches 821, 815 are connected by lines 83,84 to the AND gates 88.

Figure 34:
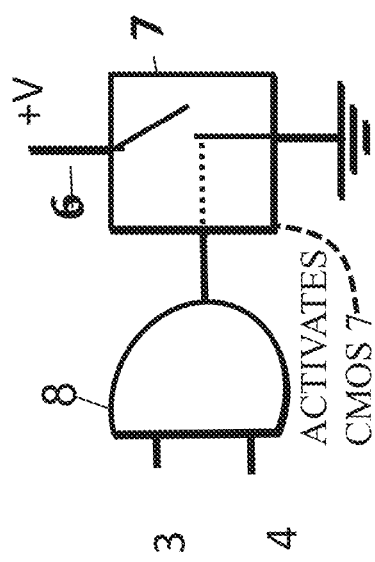
FIG. 34 is a schematic diagram showing the Cmos 7 and AND gate 8 components of the preferred embodiment.

When a writing operation performed on disk 813, the disk 813 inserted into an electronic system that can apply voltage pulses of, at most, a few milliseconds to the control electrodes (lines 83, 84) on the disk. The voltages may be a few millivolts. Pulse generators 814 and 818 are controlled by processor 822. Processor 822 controls switches 821, 815 that control the AND gates 88. Under control of the processors 822, using the pulse generators 814 and 818. Pulse generator 818 is connected to switches 821 via lines 819. Depending on the bit selected, voltage pulses are simultaneously applied to specific switches 821 and 815 in order to actuate the AND gates 8 (shown in FIG. 34) to turn on the laser heater current that will reduce either the permeability of the permalloy bits and/or their saturation magnetization (Ni bits). Note there may be an individual heater for each individual bit as shown in connection with the magnetic sensor 11 shown in FIG. 35A.

FIG. 36B differs from FIG. 36A in that electrodes or contacts 823 are used to connect externally mounted electrical switches 821 and switches 815 to the disc. Electrical switches 815, 821 determine which AND gate 88 is actuated.

Reading the Media

The media on the disk 813 can be read by placing the media in a reader system that can spin the disk 813 under a read head as in a hard disk computer system. The reader system also contains a magnetic sensor that is either a magnetic tunnel junction (MTJ) or a spin transfer oscillator. As represented in FIG. 35A, the disk 813 (or media) will spin 5 to 20 nm from the magnetic sensor 11. The reader system will also have a coil system carrying a current or a permanent magnetic that provides a magnetic field of 10 to 100 Oe directed in the plane of the disk. This field passes by the magnetic sensor. The magnetic sensor reads the media by detecting changes in the probe field as the magnetic sensor passes over the media as shown diagrammatically in FIG. 35B. The radial position of the read head can be changes to read bits on the different circular bit tracks 817 shown in FIGS. 36A, 36B. The spatial relationships between the magnetic sensor in the read head, the magnetic bits, and the probe field are shown in FIG. 35B.

As used herein, the terminology "STO" means spin transfer, a spin transfer torque, or spin torque microwave oscillator which can be either a spin valve or a magnetic tunnel junction.

As used herein, the terminology "mixer" or "frequency mixer" refers to a circuit that creates new frequencies from two frequencies f1 and f2 that are inputted so as to produce the sum f1+f2 and/or difference f1−f2 of the original frequencies.

As used herein the terminology "processor" includes computer, controller, CPU, microprocessor; multiprocessor, minicomputer, main frame, personal computer, PC, coprocessor, and combinations thereof or any machine similar to a computer or processor which is capable of processing algorithms.

As used herein, the terminology "substrate: means a substance or layer that underlies something, or on which some process occurs.

As used herein, the term "medium" or "media" (plural) means a material or substance regarded as the means of transmission of a force or effect; or a channel or system of communication, information, or entertainment; or a mode of expression or communication or something (as a magnetic disk) on which information may be stored.

The foregoing description of the specific embodiments are intended to reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification.

What is claimed is:

1. A memory system for storing information comprising:
   a substrate;
   magnetic material operatively associated with the substrate, the magnetic material having at least one ferromagnetic region configured to store data having a first state of high permeability and a second state of low permeability; the at least one ferromagnetic region in the first state configured to be modifiable to a state of low permeability upon heating to permit modification of the bits of data;
   at least one laser operatively associated with the at least ferromagnetic region which selectively provides heat to the at least one ferromagnetic region to change its permeability; and
   a plurality of connectors operatively connected to the laser and adapted to be connected to a current source that provides a current which causes the laser to emit light that heats to change the permeability of the at least one ferromagnetic region.

2. The memory system of claim 1 further comprising at least one magnet configured to provide at least one magnetic probe field; the ferromagnetic regions being subjected to the at least one magnetic probe field;
    a reader comprising a sensor in close proximity to the ferromagnetic regions that operates to read information by detecting changes in the at least one magnetic probe field dependent on the magnetic permeability of the ferromagnetic regions.

3. The memory system of claim 1 wherein the at least one laser is operatively associated with the at least ferromagnetic region and selectively provides energy to the at least one ferromagnetic region using an evanescent field from a near field transducer to achieve heating in a small region.

4. The memory system of claim 3 wherein the at least one laser provides a laser beam that produces an evanescent wave that is reflected by a mirror into an objective lens which focuses the laser light beam into a solid immersion lens, and wherein the tube diameter of laser heater cavity that produces the evanescent wave is less than the wavelength of the light beam such that the portion that is emitted is less than wavelength.

5. The memory system of claim 4 wherein the objective lens comprises an object space that has a high-refractive-index of at least 2.5; and wherein the energy in the focused spot can be coupled evanescently into the medium situated in the near field of the optical spot to produce a near field transducer.

6. The memory system of claim 5 wherein the distance between the solid immersion lens and the least one ferromagnetic region is less than half the diameter of the spot produced by the at least one laser on the substrate.

7. The memory system of claim 6 wherein the at least one laser comprises two lasers, a first laser producing evanescent wave and a second laser operating to heat the area around the targeted ferromagnetic region.

8. The memory system of claim 1 further comprising logic circuitry operatively connected to the at least one heater and the plurality of connectors, the logic circuitry configured to allow current to flow to the laser and read circuitry operatively associated with the at least one ferromagnetic region configured to read the state of the ferromagnetic regions based upon the permeability of the at least one ferromagnetic region.

9. The memory system of claim 8 further comprising at least one AND gate operatively connected to the plurality of connectors and at least one switch operatively connected to the output of the at least one AND gate such that activation of the at least one AND gate closes the at least one switch which allows current to flow to the at least one laser.

10. The memory system of claim 8 arranged as an array of memory cells, each cell comprising the at least one ferromagnetic region and the at least one laser, and wherein the plurality of connectors interconnect the memory cells; and further comprising a magnetic field source and a magnetic field sensor to determine the states of the array of ferromagnetic regions.

11. The memory system of claim 8 wherein the at least one ferroelectric region comprises an array of ferromagnetic regions configured on a disk and wherein the plurality of connectors comprise concentric connectors positioned on the disk and wherein the at least one ferromagnetic region comprises one of a Cu/Ni bilayers, Metglas, alternating layers of copper and nickel or alternating layers of copper and permalloy.

12. The memory system of claim 11 wherein the array of cells is used to store data and each cell has 2 states, a first permeable amorphous state and a second state which is crystalline.

13. The memory system of claim 8 further comprising a reader, the reader comprising a magnetic field source and a magnetic field sensor comprising an antiferromagnetic layer, a free ferromagnetic layer wherein magnetization is free to rotate, and a fixed magnetic layer, the free ferromagnetic layer and the fixed magnetic layer being separated by a thin oxide layer through which electrons tunnel, the tunneling resistance being minimized when the magnetizations of the free ferromagnetic layer and the fixed magnetic layer are parallel to one another, and wherein the voltage differential of the magnetic field sensor is determined by passing a current through the magnetic field sensor to determine whether the ferromagnetic region has a high or a low magnetic permeability.

14. A nonvolatile memory comprising at least one laser and an array of cells, each cell comprising:
    a ferromagnetic region having permeability which changes from a first state to a second state of lower permeability upon heating by the at least one laser;
    a first layer which changes temperature upon application of heat from the at least one laser operatively associated with the ferromagnetic region which selectively provides heat to the ferromagnetic region to change its permeability; and
    a plurality of conductors operatively connected to the first layer and adapted to be connected to a current source that provides a current to the at least one laser which causes the at least one laser to emit heat to change the ferromagnetic region from a first state to a second state.

15. The nonvolatile memory of claim 14 wherein the array is configured on a disk and wherein the plurality of connectors comprise concentric connectors positioned on the disk and wherein when the ferromagnetic region changes to the second state, the ferromagnetic region becomes substantially crystalline in structure.

16. The nonvolatile memory of claim 14 further comprising logic circuitry operatively connected to the first layer and the plurality of conductors, the logic circuitry configured to allow current to flow to the at least one laser, the at least one laser providing an individually controlled laser light beam to each of a plurality of the ferromagnetic regions.

17. The nonvolatile memory of claim 16 further comprising an AND gate operatively connected to the plurality of connectors and at least one switch operatively connected to the output of the at least one AND gate such that activation of the at least one AND gate closes the at least one switch which allows current to flow to the at least one laser.

18. The nonvolatile memory of claim 14 further comprising a magnetic field source and a magnetic field sensor and a detector of resistance to determine the states of the array of memory cells.

19. The nonvolatile memory of claim 14 wherein the ferromagnetic region comprises one of a Cu/Ni bilayers, Metglas, alternating layers of copper and nickel or Cu/pennalloy bilayers or alternating layers of copper and permalloy and wherein the ferromagnetic region changes from a first permeable amorphous state to a second crystalline state and wherein each cell has a magnetic field sensor operatively associated therewith and wherein the array is radiation hard.

20. A method of recording data comprising:
    providing an array of memory cells, each cell comprising at least one ferromagnetic region having permeability which changes from a first state to a second state of lower permeability upon heating and a heater operatively associated therewith; and recording data by heating the at least one ferromagnetic region with at least one laser to change the states of the at least one ferromagnetic region from a first state to a second state of lower permeability, the at least one ferromagnetic region being heated until melting thereof and then cooled quickly to become amorphous with a high permeability.

* * * * *